US007816185B2

(12) United States Patent
Munakata et al.

(10) Patent No.: US 7,816,185 B2
(45) Date of Patent: Oct. 19, 2010

(54) METHOD OF MANUFACTURING A SEMICONDUCTOR DEVICE

(75) Inventors: Tadashi Munakata, Nanae (JP); Shingo Oosaka, Hakodate (JP); Mitsuru Kinoshita, Hakodate (JP); Yoshihiko Yamaguchi, Iide (JP); Noriyuki Takahashi, Yonezawa (JP)

(73) Assignees: Renesas Electronics Corporation, Kawasaki-shi (JP); Renesas Northern Japan Semiconductor, Inc., Chitose-shi (JP)

( * ) Notice: Subject to any disclaimer, the term of this patent is extended or adjusted under 35 U.S.C. 154(b) by 0 days.

(21) Appl. No.: 12/534,183

(22) Filed: Aug. 3, 2009

(65) Prior Publication Data

US 2009/0291529 A1    Nov. 26, 2009

Related U.S. Application Data

(60) Division of application No. 12/118,752, filed on May 12, 2008, now Pat. No. 7,579,216, which is a continuation of application No. 11/360,512, filed on Feb. 24, 2006, now Pat. No. 7,384,820, which is a division of application No. 10/462,463, filed on Jun. 17, 2003, now Pat. No. 7,033,857.

(30) Foreign Application Priority Data

Jul. 22, 2002    (JP) .............................. 2002-211939

(51) Int. Cl.
*H01L 23/485*    (2006.01)

(52) U.S. Cl. ................ 438/113; 257/E21.505

(58) Field of Classification Search ................ 438/123, 438/458, 462; 257/620, E21.505
See application file for complete search history.

(56) References Cited

U.S. PATENT DOCUMENTS

| 6,365,438 | B1 * | 4/2002 | Ishida et al. ................. 438/118 |
| 6,448,151 | B2 | 9/2002 | Tateishi |
| 6,596,561 | B2 | 7/2003 | Takahashi et al. |
| 6,646,334 | B2 | 11/2003 | Hur |
| 7,005,310 | B2 * | 2/2006 | Hanada et al. ................. 438/25 |
| 7,148,126 | B2 | 12/2006 | Mita |
| 7,239,337 | B2 | 7/2007 | Ogihara et al. |
| 2002/0039807 | A1 * | 4/2002 | Koyama ..................... 438/106 |

(Continued)

FOREIGN PATENT DOCUMENTS

JP    2000-077363 A    3/2000

(Continued)

*Primary Examiner*—Nathan W Ha
(74) *Attorney, Agent, or Firm*—Miles & Stockbridge P.C.

(57) ABSTRACT

A semiconductor device manufacturing method comprising the steps of providing a matrix substrate having a main surface with plural device areas formed thereon, fixing plural semiconductor chips to the plural device areas respectively, then sealing the plural semiconductor chips all together with resin to form a block sealing member, dividing the block sealing member and the matrix substrate for each of the device areas by dicing, thereafter rubbing a surface of each of the diced sealing member portions with a brush, then storing semiconductor devices formed by the dicing once into pockets respectively of a tray, and conveying the semiconductor devices each individually from the tray. Since the substrate dividing work after block molding is performed by dicing while vacuum-chucking the surface of the block sealing member, the substrate division can be done without imposing any stress on an external terminal mounting surface of the matrix substrate.

7 Claims, 30 Drawing Sheets

U.S. PATENT DOCUMENTS

| | | |
|---|---|---|
| 2002/0041016 A1 | 4/2002 | Hyodo et al. |
| 2002/0074639 A1 | 6/2002 | Kim et al. |
| 2002/0081772 A1* | 6/2002 | Madrid et al. ............... 438/108 |
| 2003/0199122 A1* | 10/2003 | Wada et al. ................. 438/113 |
| 2004/0029318 A1* | 2/2004 | Kazama ...................... 438/127 |
| 2004/0032013 A1 | 2/2004 | Cobbley et al. |
| 2005/0156309 A1 | 7/2005 | Fujii et al. |

FOREIGN PATENT DOCUMENTS

| | | |
|---|---|---|
| JP | 2001-023936 A | 1/2001 |
| JP | 2001-024003 A | 1/2001 |
| JP | 2001-077057 A | 3/2001 |
| JP | 2001-085449 A | 3/2001 |

* cited by examiner

METHOD OF MANUFACTURING A SEMICONDUCTOR DEVICE

CROSS-REFERENCE TO RELATED APPLICATIONS

This application is a division of application Ser. No. 12/118,752 filed May 12, 2008 now U.S. Pat. No. 7,579,216, which is a continuation of application Ser. No. 11/360,512 filed Feb. 24, 2006, (now U.S. Pat. No. 7,384,820), which is a division of application Ser. No. 10/462,463 filed Jun. 17, 2003, (now U.S. Pat. No. 7,033,857).

BACKGROUND OF THE INVENTION

The present invention relates to a semiconductor device manufacturing technique and more particularly to a technique which is effectively applicable to dividing a resin-sealed portion into individual pieces by dicing.

As a CSP (Chip Size Package) which is a small-sized semiconductor device there has been developed one in which a semiconductor chip is mounted on a substrate.

Regarding in what manner a substrate for CSP is to be divided, it is described, for example, in Japanese Unexamined Patent Publication Nos. 2001-23936, 2001-24003, 2001-77057, 2001-85449, and 2000-77363.

In the above publication 2001-23936 there is disclosed a hole or a bar code as a jig identifying mark in a substrate dividing apparatus. In the above publication 2001-24003 there is disclosed a method wherein a CSP substrate is divided using a dedicated jig to improve the productivity. In the above publication 2001-77057 there is disclosed a technique wherein a CSP substrate is divided into individual pellets and then contamination adhered to back surfaces of the pellets is removed before placing the pellets onto a conveyance tray. In the above publication 2001-85449 there is disclosed a CSP substrate holding technique which is applied at the time of dividing a CSP substrate into individual pellets and subsequently placing the pellets onto a conveyance tray. Further, in the above publication 2000-77363 there is disclosed a technique wherein a CSP is cut while it is accommodated in a dedicated jig, followed by washing and drying.

In dividing a CSP, it is important to determine what structure of a jig is to be used in the dividing work and which of a surface and a back of the substrate is to be used as a substrate holding surface (a substrate chucking surface in the case of vacuum chuck). For example, a substrate holding member (jig) disclosed in the foregoing publication 2001-85449 has first holes for chucking divided individual pellets, second holes for chucking pellets in areas adjacent to the first holes during jig conveyance, and third holes (fine through holes) for preventing a lowering of the substrate holding force due to the leakage of air from the first holes. Thus, the structure of this jig is complicated, resulting in the jig being expensive, which is a problem.

There also arises the problem that the jig is large-sized and heavy to ensure air paths for the aforesaid three holes and that the manufacturing cost and space for a jig handling mechanism increase.

As to which of a surface and a back of a substrate is to be used as a substrate holding surface, there is not found a clear description in any of the foregoing five publications.

SUMMARY OF THE INVENTION

It is an object of the present invention to provide a semiconductor device manufacturing method which permits dividing a wiring substrate without imposing any stress on an external terminal mounting surface of the substrate.

It is another object of the present invention to provide a semiconductor device manufacturing method which facilitates recognizing dividing positions at the time of dividing a wiring substrate.

It is a further object of the present invention to provide a semiconductor device manufacturing method which permits easy removal of cutting wastes adhered to an external terminal mounting surface of a wiring substrate.

The above and other subjects and objects, as well as novel features, of the present invention will become apparent from the following description and the accompanying drawings.

Typical modes of the present invention as disclosed herein will be outlined below.

In one aspect of the present invention there is provided a method of manufacturing a semiconductor device, comprising the steps of providing a wiring substrate having a main surface with plural device areas formed thereon, fixing plural semiconductor chips to the plural device areas respectively, disposing the plural semiconductor chips in the interior of one cavity formed in a molding die and covering the plural device areas all together with the cavity, sealing the plural semiconductor chips all together with resin to form a block sealing member, and dividing the block sealing member and the wiring substrate for each of the device areas by dicing while chucking a surface of the block sealing member through a plate-like jig.

In another aspect of the present invention there is provided a method of manufacturing a semiconductor device, comprising the steps of providing a semiconductor wafer with a protective sheet affixed beforehand to a back surface thereof, disposing the semiconductor wafer on a porous jig in such a manner that the protective sheet is interposed therebetween, and half-cutting the semiconductor wafer by dicing while chucking the wafer from the back surface side thereof through the porous jig.

DETAILED DESCRIPTION OF PREFERRED EMBODIMENTS

Figure 1:
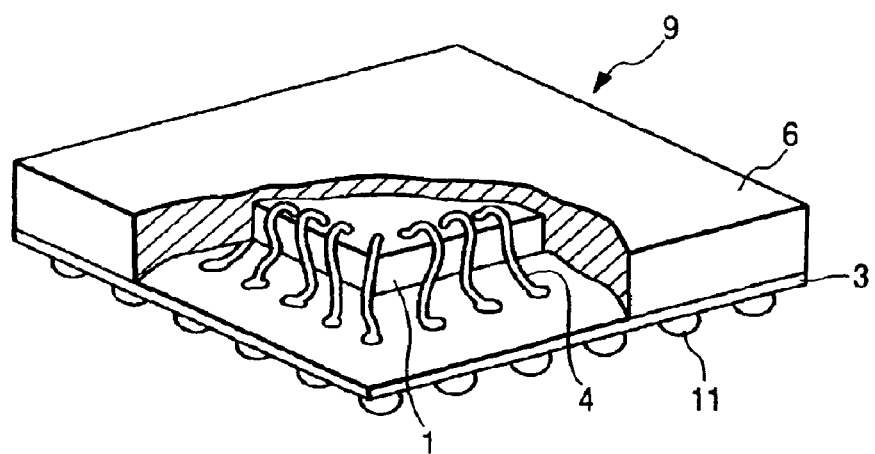
FIG. 1 is a partially cut-away perspective view showing a structural example of a semiconductor device which is assembled by a semiconductor device manufacturing method according to a first embodiment of the present invention.

In the following embodiments, as to the same or similar portions, repeated explanations thereof will be omitted except where required in principle.

Where required for convenience' sake, the following embodiments will be described in a divided manner into plural sections or embodiments, but unless otherwise mentioned, they are not unrelated to each other, but are in a relation such that one is a modification, a description of details, or a supplementary explanation, of part or the whole of the other.

In the following embodiments, when reference is made to the number of elements (including the number, numerical value, quantity, and range), no limitation is made to the number referred to, but numerals above and below the number referred to will do as well unless otherwise mentioned and except the case where it is evident that limitation is made to the number referred to.

Embodiments of the present invention will be described in detail hereinunder with reference to the accompanying drawings. In all of the drawings for illustration of the embodiments, constituent members having the same functions are identified by the same reference numerals, and repeated explanations thereof will be omitted.

First Embodiment

Figure 2:
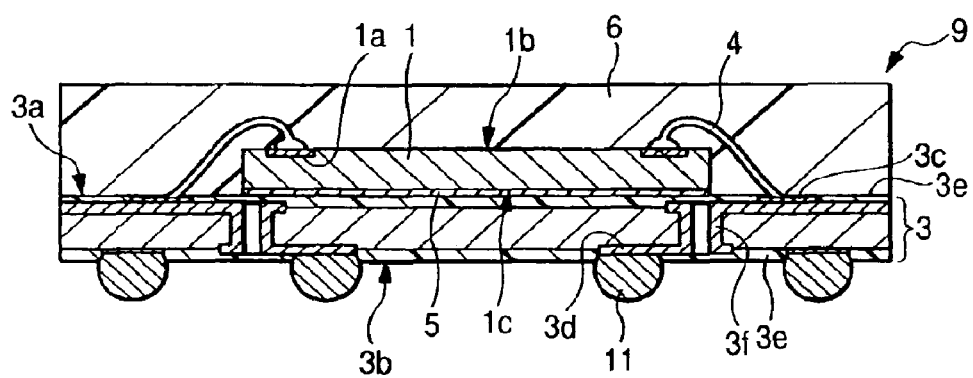
FIG. 2 is a sectional view showing the structure of the semiconductor device illustrated in FIG. 1.
Figure 3:
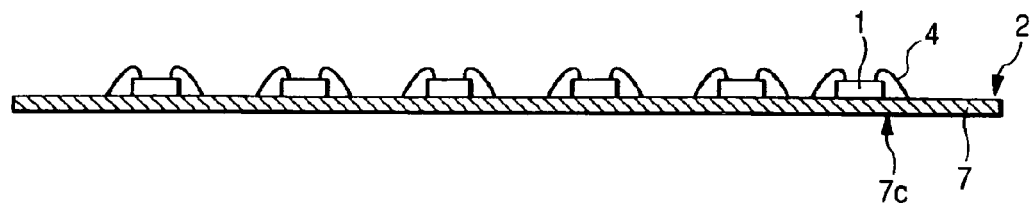
FIG. 3 is a sectional view showing a structural example after wire bonding in the semiconductor device manufacturing method of the first embodiment.
Figure 4:
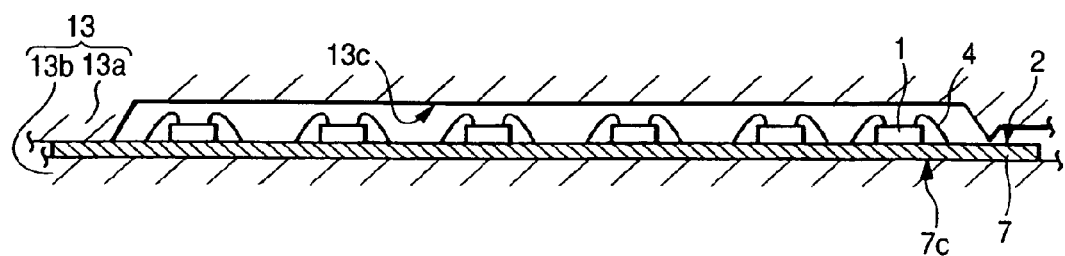
FIG. 4 is a partial sectional view showing an example of a state in block molding with resin in the semiconductor device manufacturing method of the first embodiment.
Figure 5:
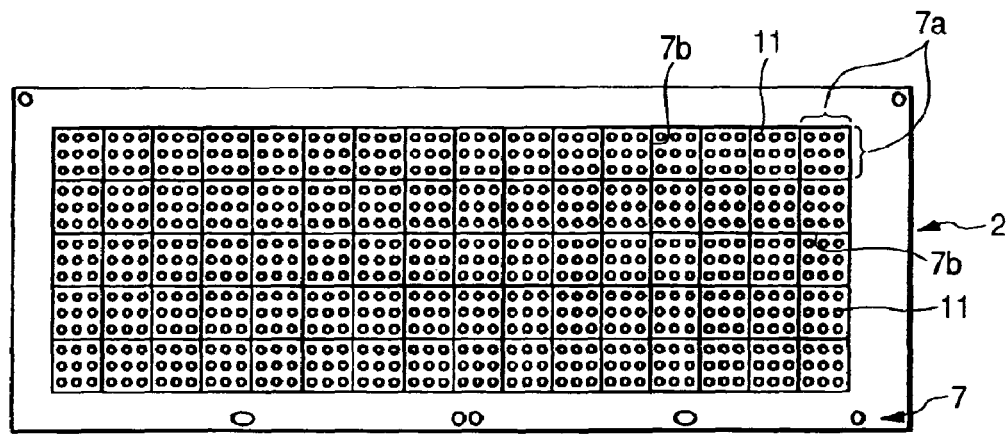
FIG. 5 is a plan view showing a structural example of an external terminal mounting surface side of an assembled product after block molding with resin in the semiconductor device manufacturing method of the first embodiment.
Figure 6:
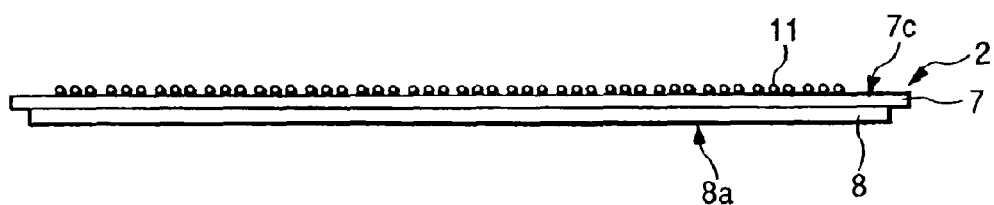
FIG. 6 is a side view showing the structure of the assembled product illustrated in FIG. 5.
Figure 7:
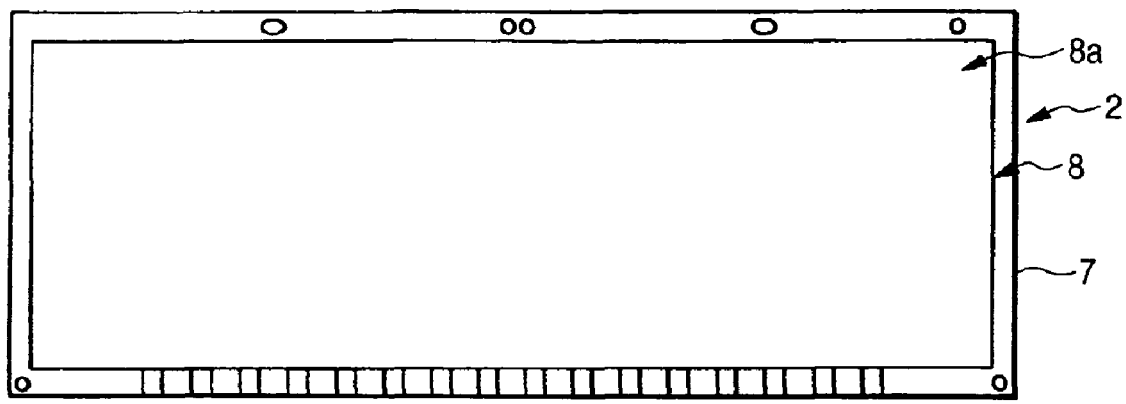
FIG. 7 is a plan view showing the structure on a block sealing member side of the assembled product illustrated in FIG. 5.
Figure 8:
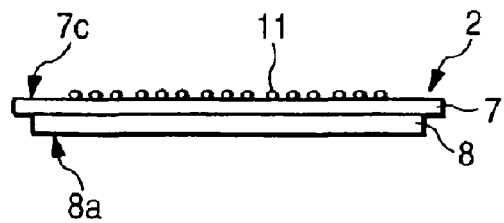
FIG. 8 is a front view showing the structure of the assembled product illustrated in FIG. 6.
Figure 9:
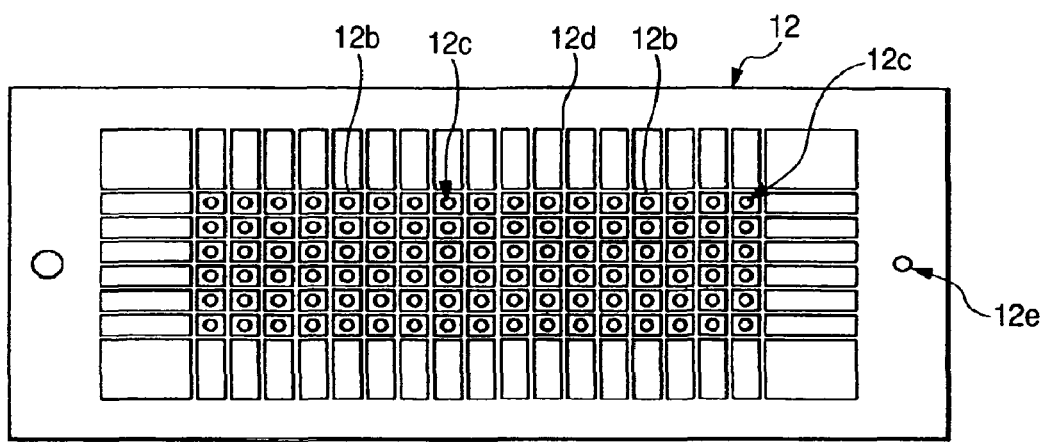
FIG. 9 is a plan view showing a structural example of a substrate holding jig used in the semiconductor device manufacturing method of the first embodiment.
Figure 10:
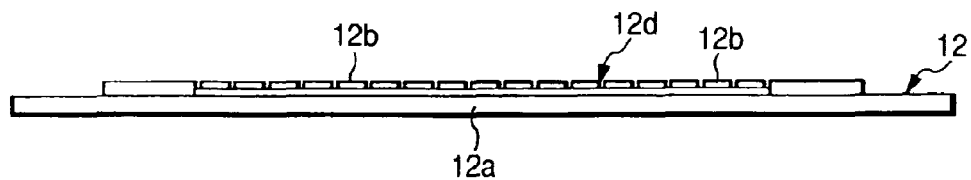
FIG. 10 is a side view showing the structure of the substrate holding jig illustrated in FIG. 9.
Figure 11:
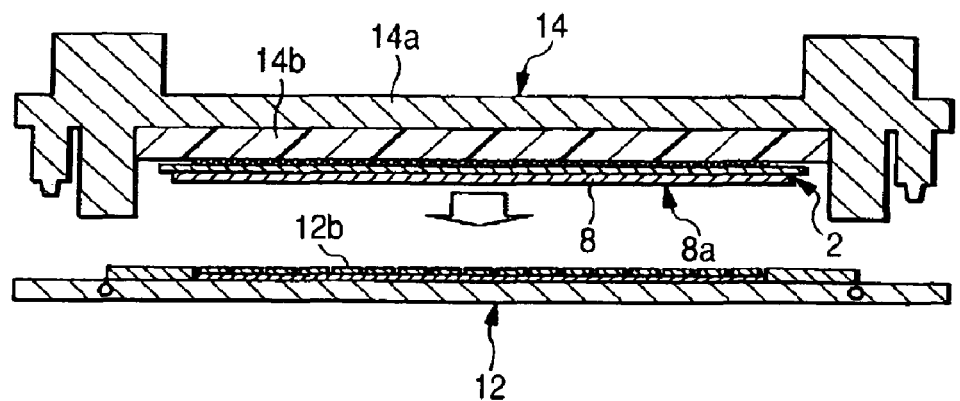
FIG. 11 is a sectional view showing a structural example of a jig transfer hand used in the semiconductor device manufacturing method of the first embodiment.
Figure 12:
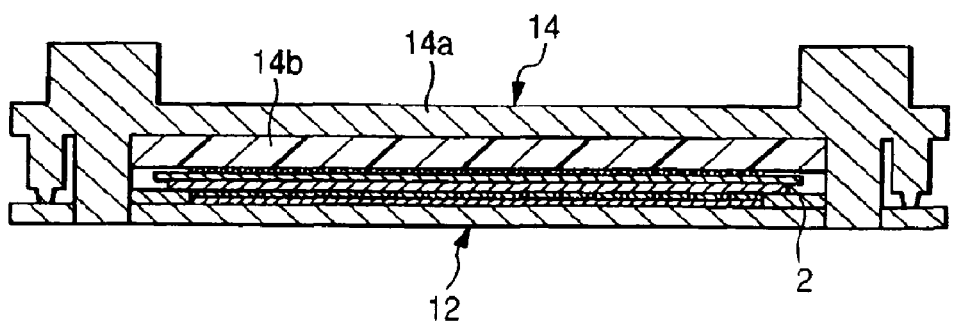
FIG. 12 is a sectional view showing an example of a state in which the assembled product is clamped by both the jig transfer hand illustrated in FIG. 11 and the substrate holding jig.
Figure 13:
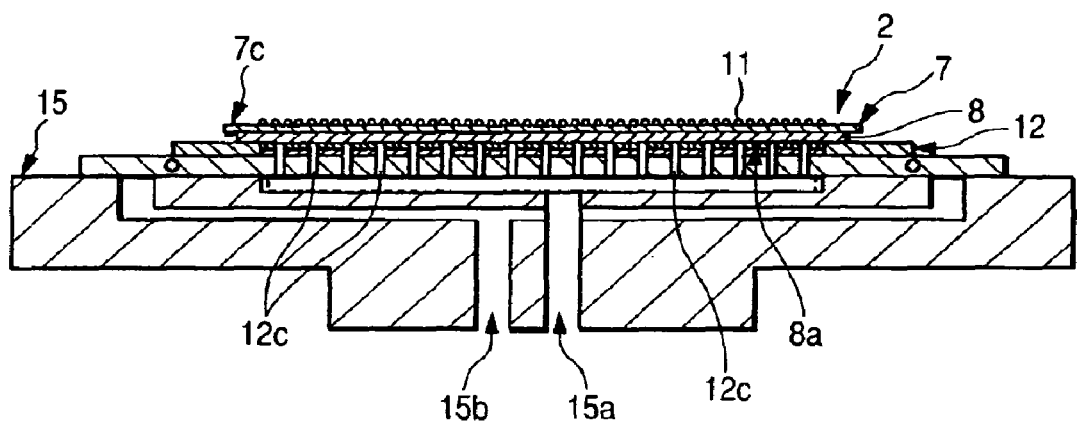
FIG. 13 is a sectional view showing a structural example in which the assembled product illustrated in FIG. 12 is disposed on a dicer cutting stage.
Figure 14:
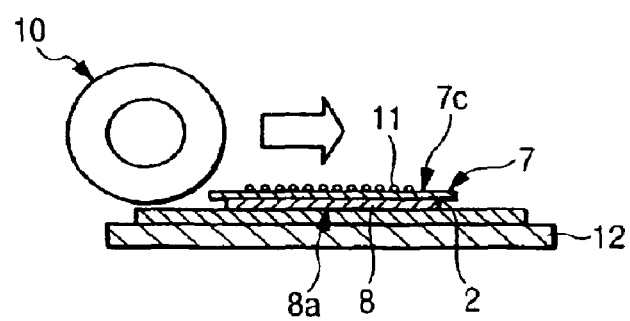
FIG. 14 is a sectional view showing an example of dicing in the substrate width direction after resin molding in the semiconductor device manufacturing method of the first embodiment.
Figure 15:
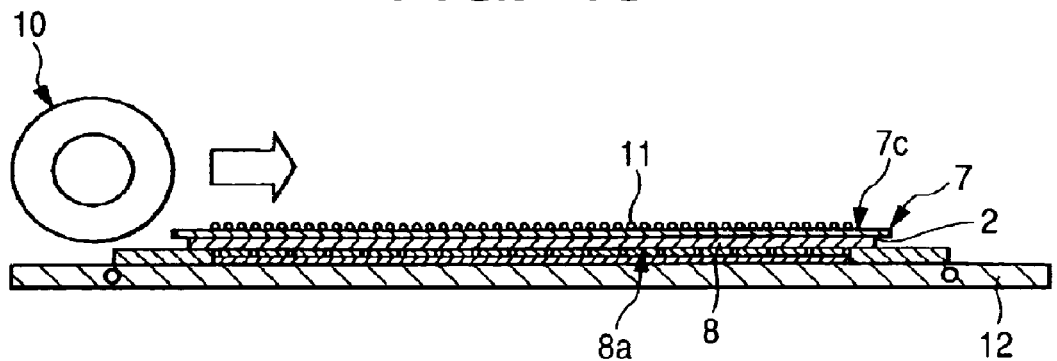
FIG. 15 is a sectional view showing an example of dicing in the substrate length direction after resin molding in the semiconductor device manufacturing method of the first embodiment.
Figure 16:
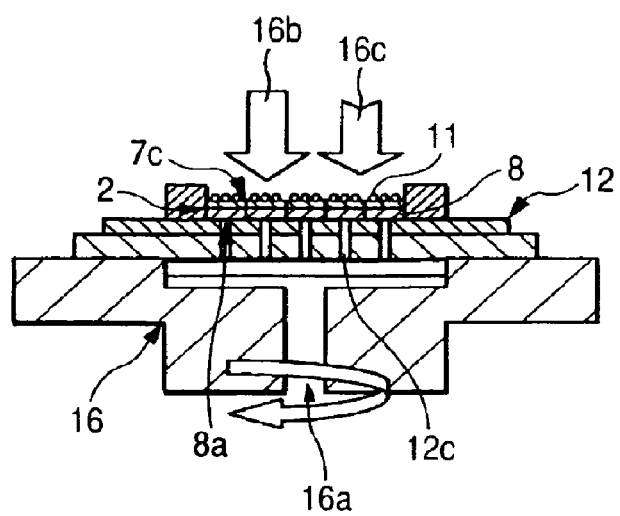
FIG. 16 is a sectional view showing an example of washing and drying for an external terminal mounting surface of a wiring substrate after dicing in the semiconductor device manufacturing method of the first embodiment.
Figure 17:
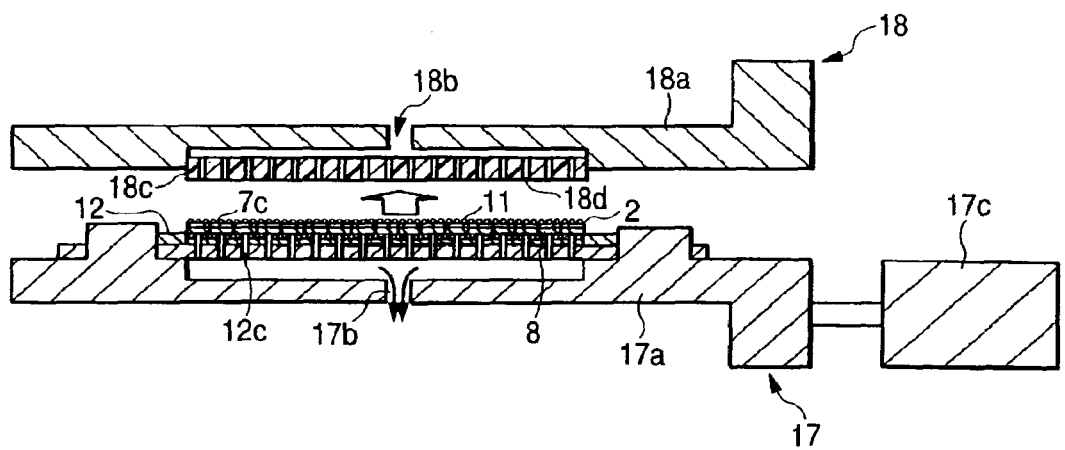
FIG. 17 is a sectional view showing an example of a method for transferring the assembled product from an inverting hand to a drainer hand in the semiconductor device manufacturing method of the first embodiment.
Figure 18:
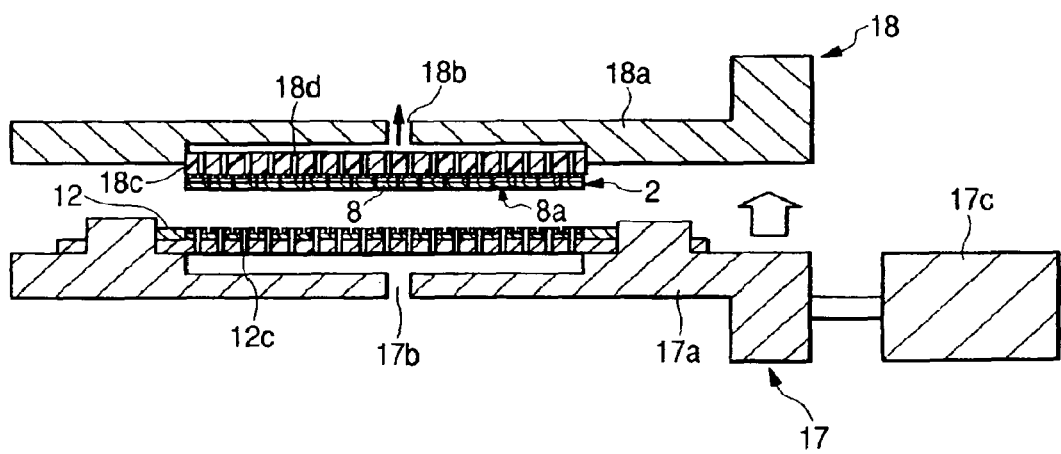
FIG. 18 is a sectional view showing an example of a state in which the assembled product is held by the drainer hand illustrated in FIG. 17.
Figure 19:
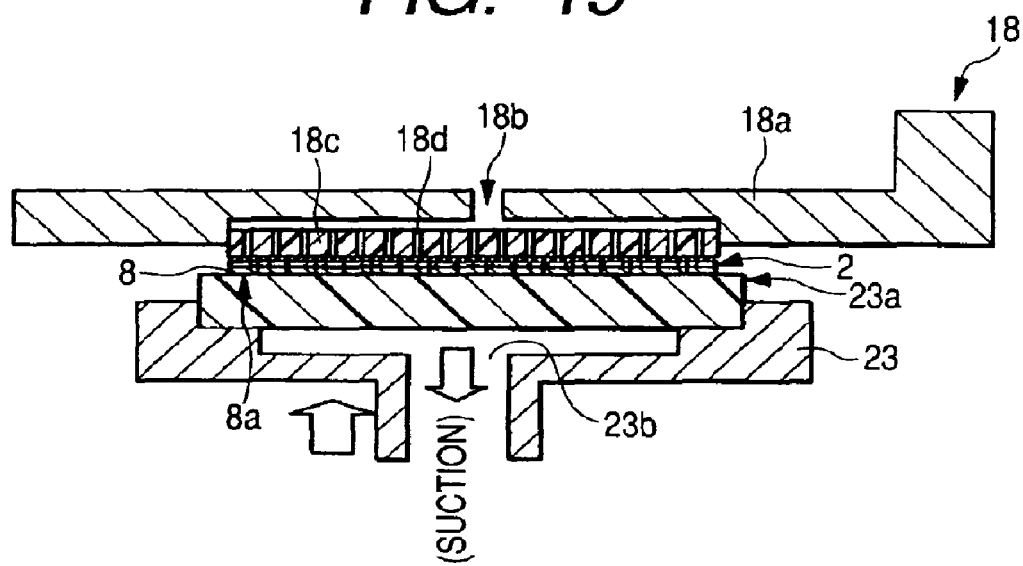
FIG. 19 is a sectional view showing an example of a method for sucking water from a surface of a sealing member in the assembled product in the semiconductor device manufacturing method of the first embodiment.
Figure 20:
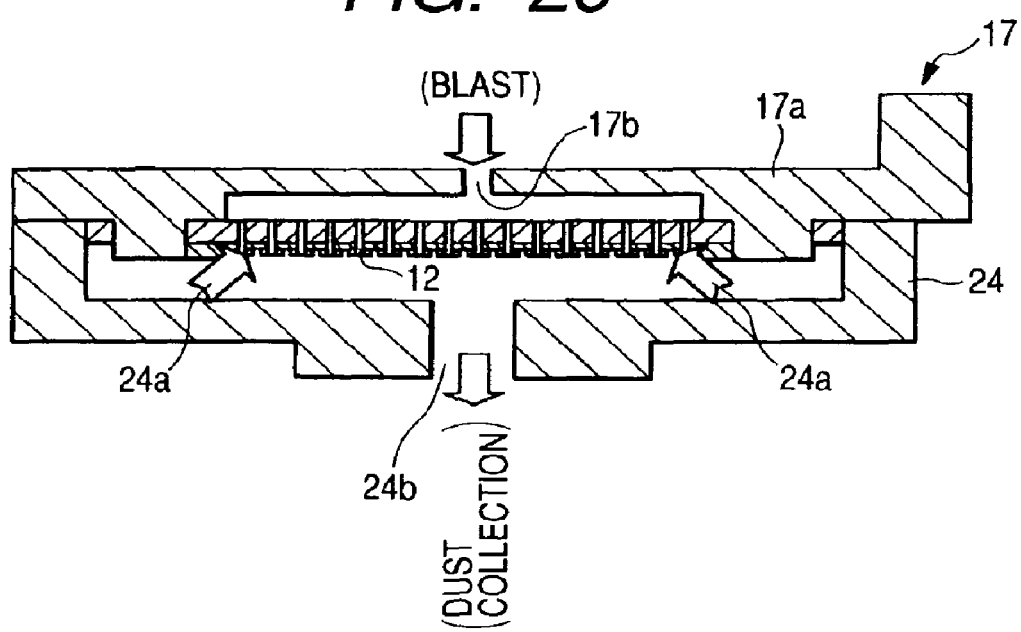
FIG. 20 is a sectional view showing an example of a method for cleaning the substrate holding jig in the semiconductor device manufacturing method of the first embodiment.
Figure 21:
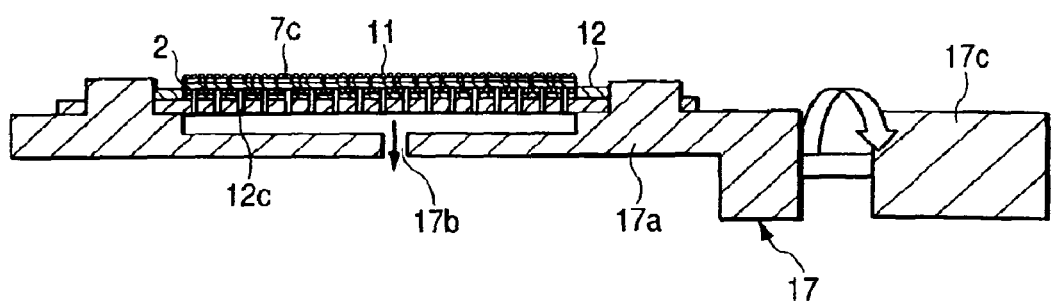
FIG. 21 is a sectional view showing an example of a state in which the assembled product is chucked by an inverting hand in the semiconductor product manufacturing method of the first embodiment.
Figure 22:
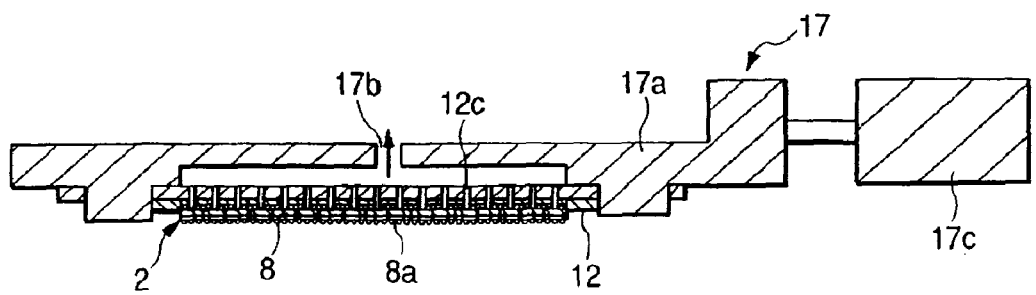
FIG. 22 is a sectional view showing an example of a method for inverting the chucked, assembled product by the inverting hand illustrated in FIG. 21.
Figure 23:
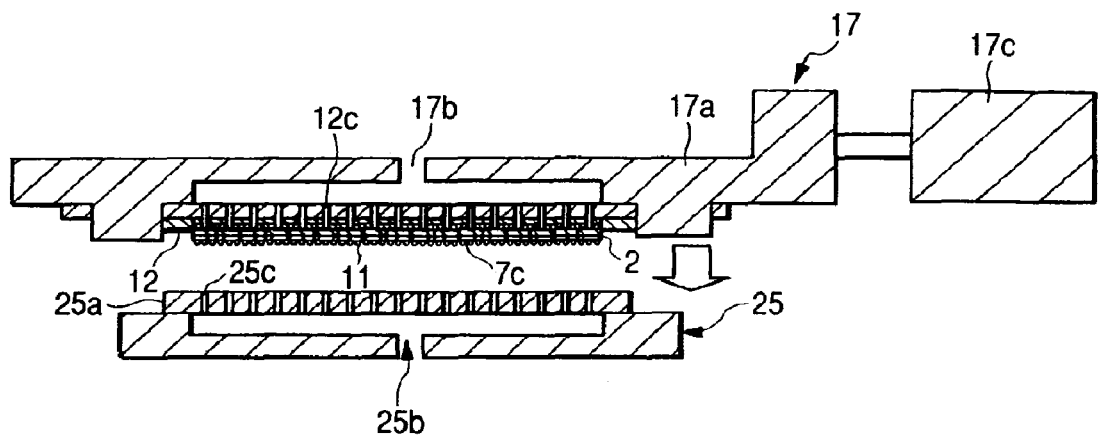
FIG. 23 is a sectional view showing an example of a method for transferring the assembled product from the inverting hand illustrated in FIG. 22 to a decontaminating zigzag stage.
Figure 24:
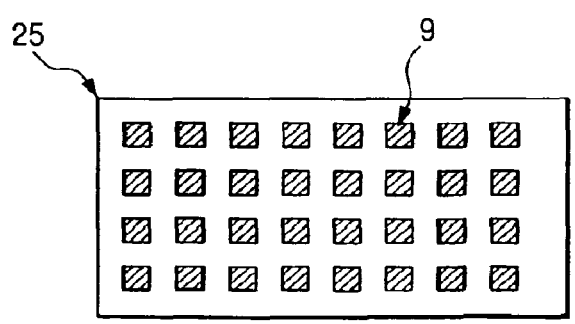
FIG. 24 is a plan view showing an example of a state of a first transfer stage in transferring the assembled product to the decontaminating zigzag stage by the transfer method illustrated in FIG. 23.
Figure 25:
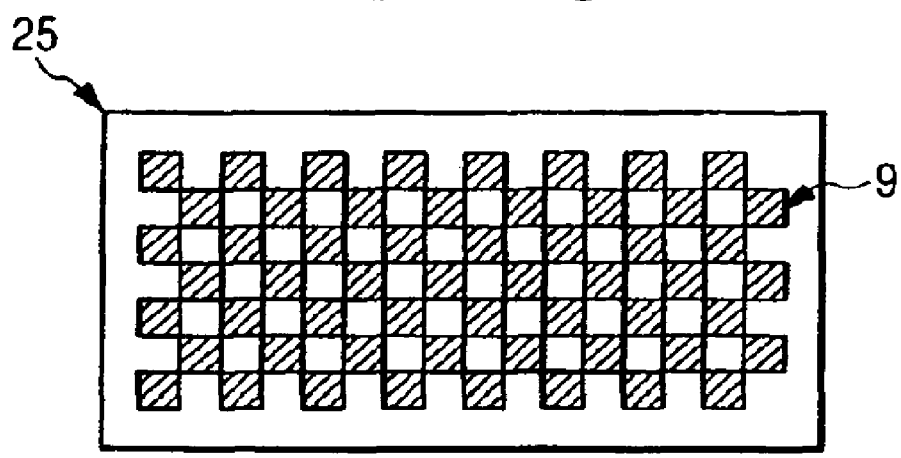
FIG. 25 is a plan view showing an example of a state of a second transfer stage in transferring the assembled product to the decontaminating zigzag stage by the transfer method illustrated in FIG. 23.
Figure 26:
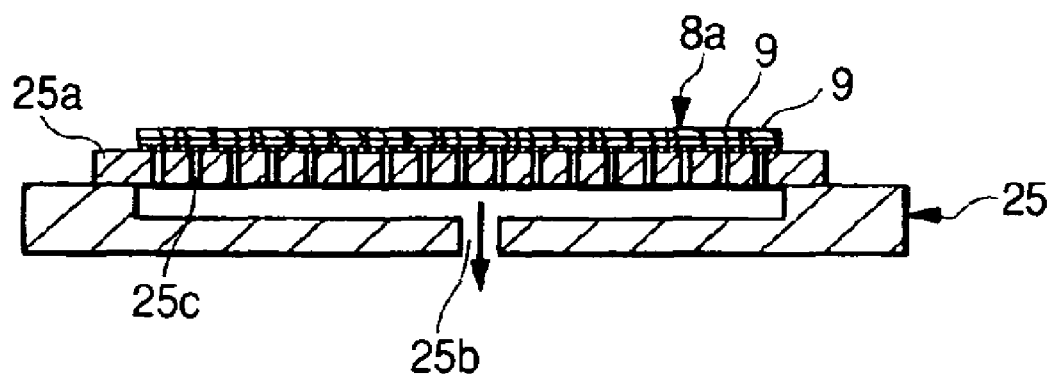
FIG. 26 is a sectional view showing an example of a state of the assembled product after transferred to the decontaminating zigzag stage through the transfer stages illustrated in FIGS. 24 and 25.
Figure 27:
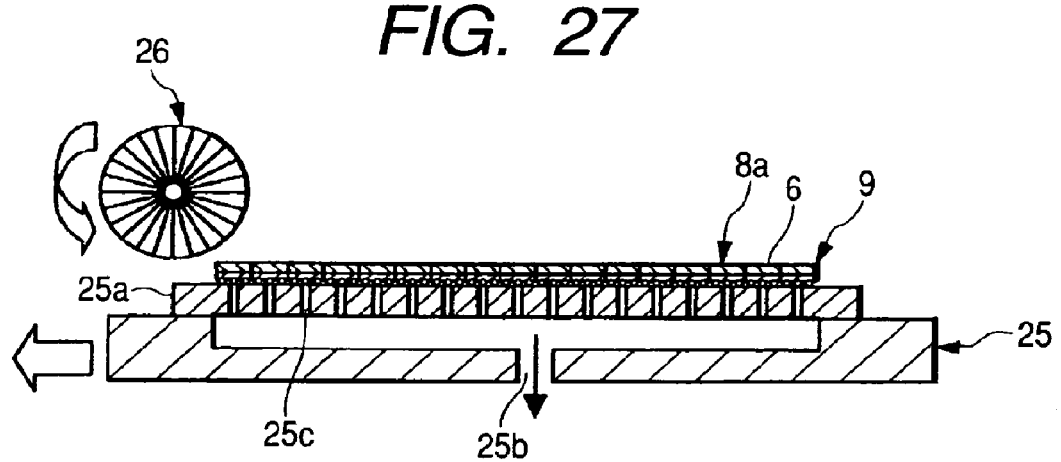
FIG. 27 is a sectional view showing an example of a method for decontaminating the surface of the sealing member in the assembled product in the semiconductor device manufacturing method of the first embodiment.
Figure 28:
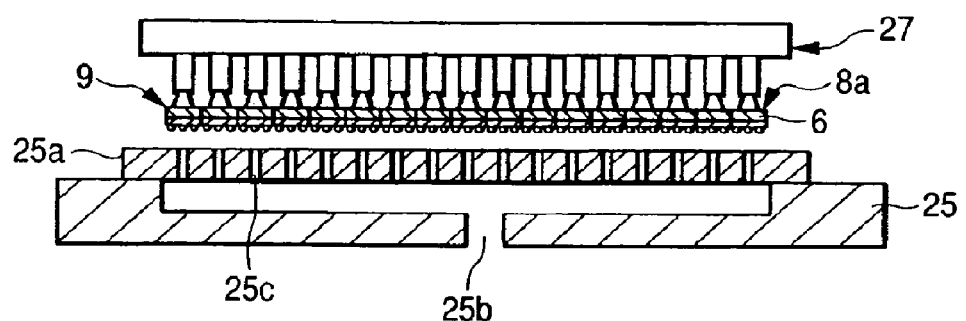
FIG. 28 is a sectional view showing an example of a state in which the assembled product after decontamination is held by block zigzag chucking.
Figure 29:
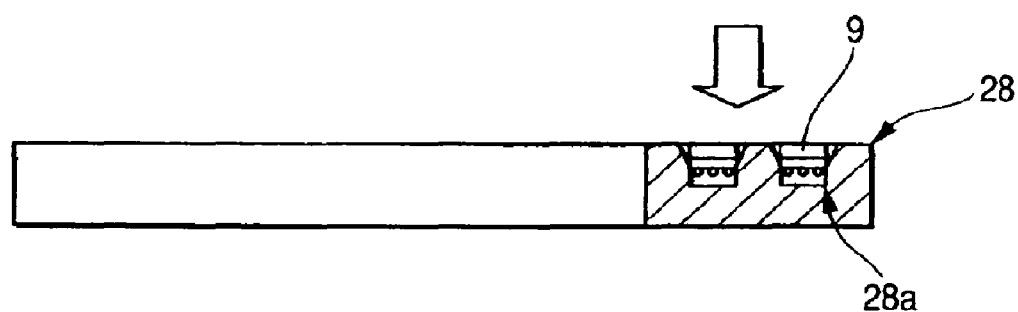
FIG. 29 is a sectional view showing an example of a method for transferring the assembled product as chucked by block zigzag chucking which is illustrated in FIG. 28.
Figure 30:
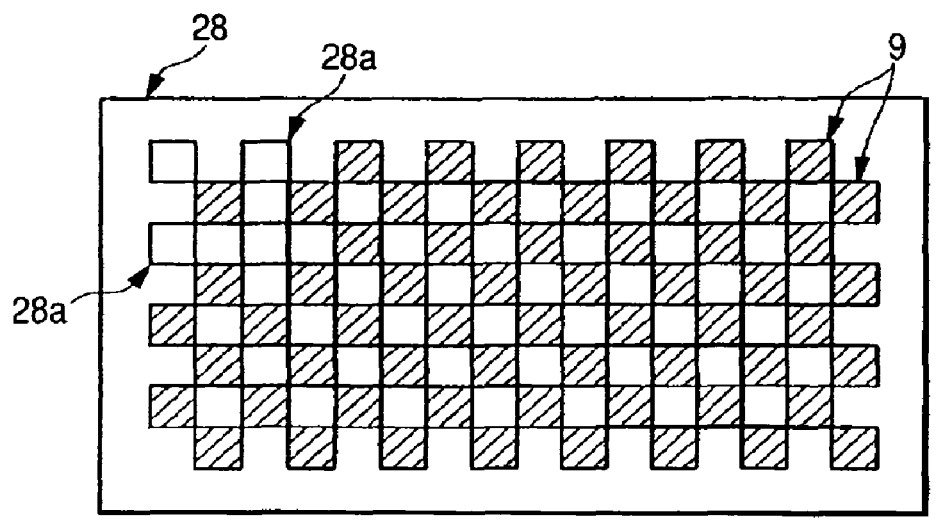
FIG. 30 is a plan view showing an example of a state after the transfer onto a zigzag pocket tray of the assembled product as chucked by block zigzag chucking which is illustrated in FIG. 28.
Figure 31:
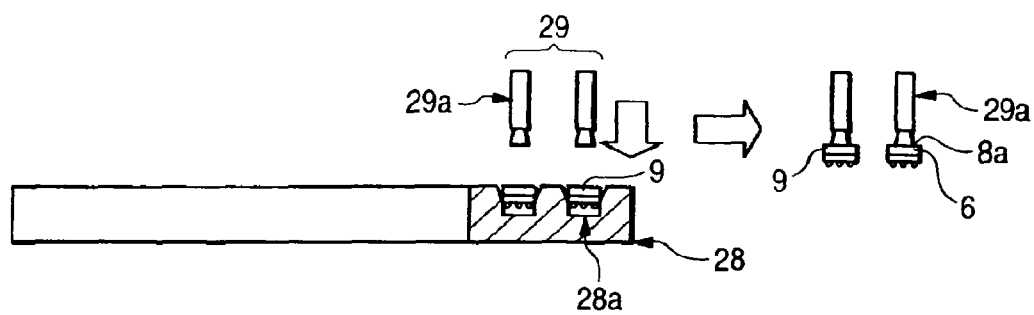
FIG. 31 is a partially cut-away side view showing an example of an individual assembled product conveying method from the zigzag pocket tray illustrated in FIG. 30.
Figure 32:
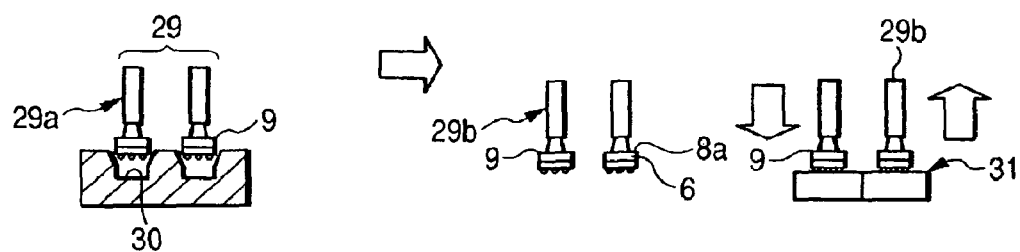
FIG. 32 is a partially cut-away side view showing an example of an electric test method after the individual product conveyance illustrated in FIG. 31.
Figure 33:
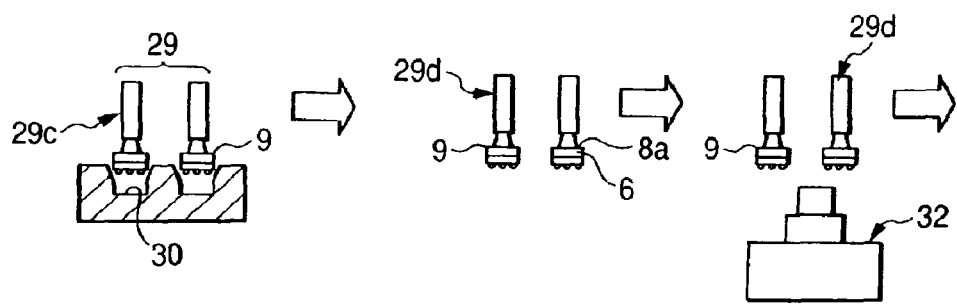
FIG. 33 is a partially cut-away side view showing an example of an appearance test method after the individual product conveyance illustrated in FIG. 32.
Figure 34:
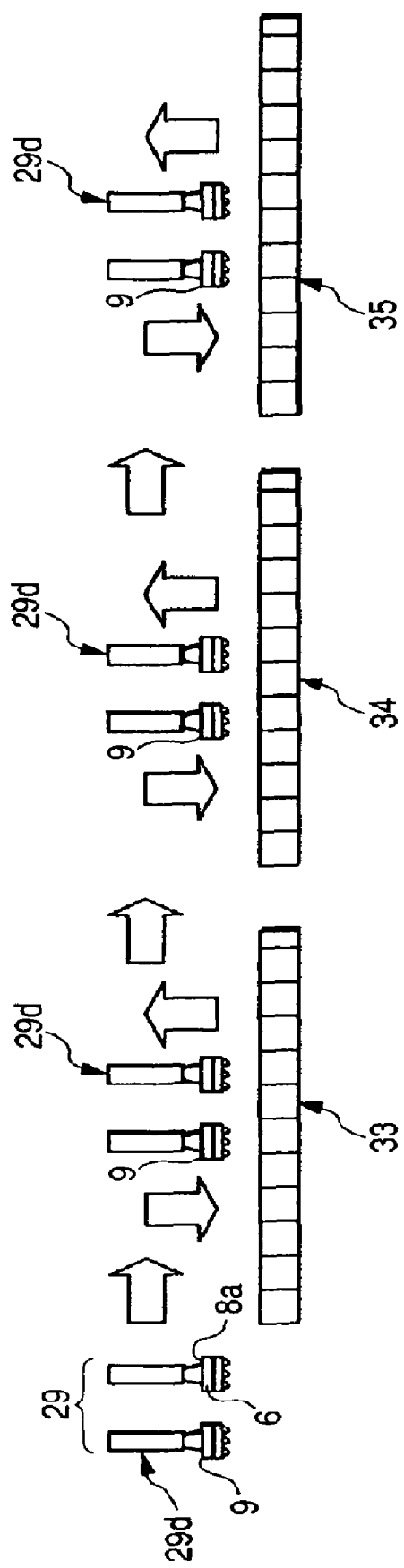
FIG. 34 is a side view showing an example of a state in which individual assembled products are classified onto separate trays in accordance with results of the tests illustrated in FIGS. 32 and 33.

FIG. 1 is a partially cut-away perspective view showing a structural example of a semiconductor device which is assembled by a semiconductor device manufacturing method according to a first embodiment of the present invention, FIG. 2 is a sectional view showing the structure of the semiconductor device illustrated in FIG. 1, FIG. 3 is a sectional view showing a structural example after wire bonding, FIG. 4 is a partial sectional view showing an example of a state in block molding with resin, FIG. 5 is a plan view showing a structural example of an external terminal mounting surface side of an assembled product after block molding with resin, FIG. 6 is a side view showing the structure of the assembled product illustrated in FIG. 5, FIG. 7 is a plan view showing the structure on a block sealing member side of the assembled product illustrated in FIG. 5, FIG. 8 is a front view showing the structure of the assembled product illustrated in FIG. 6, FIG. 9 is a plan view showing a structural example of a substrate holding jig used in the semiconductor device manufacturing method of the first embodiment, FIG. 10 is a side view showing the structure of the substrate holding jig illustrated in FIG. 9, FIG. 11 is a sectional view showing a structural example of a jig transfer hand used in the semiconductor device manufacturing method of the first embodiment, FIG. 12 is a sectional view showing an example of a state in which the assembled product is clamped by both the jig transfer hand illustrated in FIG. 11 and the substrate holding jig, FIG. 13 is a sectional view showing a structural example in which the assembled product illustrated in FIG. 12 is disposed on a dicer cutting stage, FIG. 14 is a sectional view showing an example of dicing in the substrate width direction after resin molding, FIG. 15 is a sectional view showing an example of dicing in the substrate length direction after resin molding, FIG. 16 is a sectional view showing an example of washing and drying for an external terminal mounting surface of a wiring substrate after dicing, FIG. 17 is a sectional view showing an example of a method for transferring the assembled product from an inverting hand to a drainer hand, FIG. 18 is a sectional view showing an example of a state in which the assembled product is held by the drainer hand illustrated in FIG. 17, FIG. 19 is a sectional view showing an example of a method for sucking water from a surface of a sealing member in the assembled product, FIG. 20 is a sectional view showing an example of a method for cleaning the substrate holding jig, FIG. 21 is a sectional view showing an example of a state in which the assembled product is chucked by an inverting hand, FIG. 22 is a sectional view showing an example of a method for inverting the chucked, assembled product by the inverting hand illustrated in FIG. 21, FIG. 23 is a sectional view showing an example of a method for transferring the assembled product from the inverting hand illustrated in FIG. 22 to a decontaminating stage, FIG. 24 is a plan view showing an example of a state of a first transfer stage in transferring the assembled product to the decontaminating zigzag stage by the transfer method illustrated in FIG. 23, FIG. 25 is a plan view showing an example of a state of a second transfer stage in transferring the assembled product to the decontaminating zigzag stage by the transfer method illustrated in FIG. 23, FIG. 26 is a sectional view showing an example of a state of the assembled product after transferred to the decontaminating zigzag stage through the transfer stages illustrated in FIGS. 24 and 25, FIG. 27 is a sectional view showing an example of a method for decontaminating the surface of the sealing member in the assembled product, FIG. 28 is a sectional view showing an example of a state in which the assembled product after decontamination is held by block zigzag chucking, FIG. 29 is a sectional view showing an example of a method for transferring the assembled product as chucked by block zigzag chucking which is illustrated in FIG. 28, FIG. 30 is a plan view showing an example of a state after the transfer onto a zigzag pocket tray of the assembled product as chucked by block zigzag chucking which is illustrated in FIG. 28, FIG. 31 is a side view showing an example of an individual assembled product conveying method from the zigzag pocket tray illustrated in FIG. 30, FIG. 32 is a side view showing an example of an electric test method after the individual product conveyance illustrated in FIG. 31, FIG. 33 is a side view showing an example of an appearance test method after the individual product conveyance illustrated in FIG. 32, FIG. 34 is a side view showing an example of a state in which individual assembled products are classified onto separate trays in accordance with results of the tests illustrated in FIGS. 32 and 33, and FIGS. 35 and 36 are manufacturing process flow charts showing a part of a procedural example from dicing after block molding up to decontamination and storage in trays.

The semiconductor device of this first embodiment illustrated in FIGS. 1 and 2 is a resin-sealed type BGA (Ball Grid Array) in which a semiconductor chip 1 is mounted on a main surface 3a of an individual substrate 3, the semiconductor chip 1 and the individual substrate 3 being electrically connected with each other through wires 4, and plural ball electrodes 11 as external terminals are arranged in a matrix form on a back surface 3b of the individual substrate 3.

The BGA 9 of this first embodiment is fabricated in the following manner. There is used a matrix substrate 7 as a wiring substrate on which such plural device areas 7a as shown in FIG. 5 are arranged in a matrix form. The matrix substrate 7 is subjected to resin molding (hereinafter referred to as "block molding") so that the plural device areas 7a, which are partitioned from one another by dicing lines 7b, are covered all together with a cavity 13c of a molding die 13 shown in FIG. 4, to form such a block sealing member 8 as shown in FIG. 6. After the resin molding, the block sealing member 8 is diced into individual pieces.

A detailed structure of the BGA 9 shown in FIGS. 1 and 2 will now be described. The BGA 9 is made up of a semiconductor chip 1, the semiconductor chip 1 having a main surface 1b and a back surface 1c, with plural pads 1a as surface electrodes and a semiconductor element being formed on the main surface 1b, an individual substrate 3, the individual substrate 3 having a main surface 3a for supporting the semiconductor chip 1 and a back surface 3b located on the side opposite to the main surface 3a, with plural connecting terminals 3c being formed on the main surface 3a, a plurality of ball electrodes 11 as external terminals formed on the back surface 3b of the individual substrate 3, a plurality of wires 4 for connecting the pads 1a on the semiconductor chip 1 with corresponding connecting terminals 3c on the individual substrate 3, and a sealing member 6 formed on the main surface 3a of the individual substrate 3 to seal the semiconductor chip and the plural wires 4 with resin.

The semiconductor chip 1 is fixed onto the main surface 3a of the individual substrate 3 through a die bonding material 5 as an adhesive.

In the individual substrate 3 there are provided internal wiring lines 3f for electric connection between the connecting terminals 3c on the main surface 3a of the individual substrate and bump lands 3d formed on the back surface 3b of the individual substrate, and an insulating film 3e which covers the main surface 3a and the back surface 3b at areas other than exposed wiring portions. The ball electrodes 11 as external terminals are provided on the bump lands 3d respectively.

The individual substrate 3 is constituted, for example, by a glass fabric-based epoxy resin board.

The ball electrodes 11 are formed by solder for example.

The semiconductor chip 1 is formed by silicon for example and a semiconductor integrated circuit is formed on the main surface 1b of the chip, further, plural pads 1a as surface electrodes for connection are formed on a peripheral edge portion of the main surface 1b.

The molding resin used for forming the sealing member 6 is, for example, a thermosetting epoxy resin.

The wires 4 to be connected by wire bonding is, for example, gold wires.

The following description is now provided about a method of manufacturing the BGA 9 of this first embodiment.

First, there is provided such a matrix substrate (wiring substrate) 7 as shown in FIG. 5 in which plural device areas 7a each having plural connecting terminals 3a are arranged in a matrix form.

There also are provided semiconductor chips 1.

Thereafter, as shown in FIG. 3, the semiconductor chips 1 are each subjected to die bonding to mount plural semiconductor chips 1 on a single matrix substrate 7.

Further, the semiconductor chips 1 are each subjected to wire bonding to connect pads 1a on each semiconductor chip 1 with connecting terminals 3c in the corresponding device area 7a on the matrix substrate 7 through wires 4.

Thereafter, block molding is performed for resin sealing.

More specifically, as shown in FIG. 4, plural semiconductor chips 1 on the matrix substrate 7 are placed in the interior of a single cavity 13c of a molding die 13 and the plural device areas 7a are covered all together with the cavity 13c, thereafter the plural semiconductor chips 1 are sealed all together with resin to form a block sealing member 8.

In this case, first the matrix substrate 7 after wire bonding is disposed on a mating surface of a lower mold 13b, then the plural device areas 7a are covered all together with the cavity 13c of an upper mold 13a and both upper and lower molds 13a, 13b are clamped.

Thereafter, a sealing resin is poured into the cavity 13c and block molding is performed.

In this way the block sealing member 8 shown in FIGS. 6 to 8 is formed.

In this first embodiment, as shown in FIGS. 5 to 8, a structure comprising the block sealing member 8 formed on the matrix substrate 7 and plural ball electrodes 11 formed on a substrate surface as an external terminal mounting surface of the matrix substrate 7 is called the assembled product 2. However, in the case of a semiconductor device not using the ball electrodes 11 as external terminals, the structure after formation of the block molding member 8 is called the assembled product 2.

Next, a description will be given below about a dicing step (division into individual pieces) for the assembled product 2 after block molding.

First, reference will be made to a substrate holding jig 12 as a plate-like jig used in the dicing step, which is illustrated in FIGS. 9 and 10.

The substrate holding jig 12 is made up of a plate-like jig body 12a and a product support portions 12b formed of rubber or the like to support the assembled product 2. In the product support portions 12b are formed grooves 12d in a lattice shape correspondingly to the dicing lines 7b.

Further, chucking holes (through holes) 12c are formed respectively in quadrangular areas (each corresponding to one product) which are defined by the grooves 12d in the product support portions 12b, and dicing is performed while chucking products through respective chucking holes 12c.

A positioning hole 12e is formed in the jig body 12a at a position outside the product support portions 12b. During dicing, positioning of the substrate holding jig 12 can be done using the positioning hole 12e.

Description is now directed to a dicing/decontaminating equipment used in this first embodiment.

Figure 35:
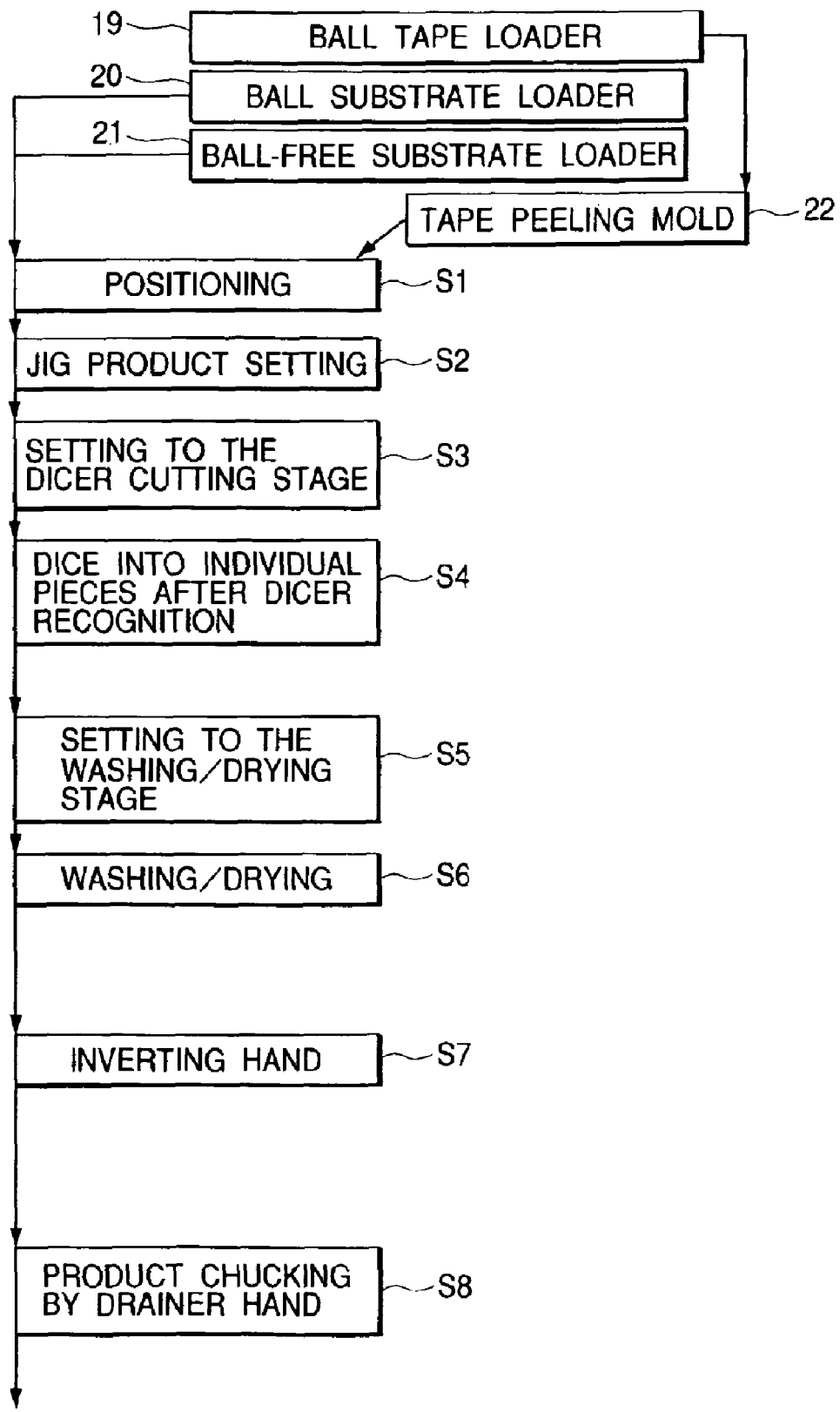
FIG. 35 is a manufacturing process flow chart showing a part of a procedural example from dicing after block molding up to decontamination and storage in trays in the semiconductor device manufacturing method of the first embodiment.

As shown in FIG. 35, the dicing/decontaminating equipment has a loader section comprising, for example, a ball tape loader 19, a ball substrate loader 20, and a ball-free substrate loader 21, which are used according to the type of product to be obtained. The loader section is equipped with a first unit on which is mounted a first rack, the first rack receiving assembled products 2 in individual grooves, and is also equipped with a second unit on which is mounted a second rack, the second rack receiving assembled products 2 in a stacked fashion.

The first rack has outlets for assembled products 2 which outlets differ depending on the type of assembled products to be received therein, for example, depending on whether the products are tape block-molded products, i.e., the type in which a tape substrate is affixed to a lead frame, or they are substrate block-molded products, i.e., substrate BGA type. Each of the tape block-molded products is pushed out by the first rack and is the conveyed to a tape peeling mold 22 for peeling the lead frame and the assembled product 2. On the other hand, each of the substrate block-molded products is pushed out by the first rack and is then conveyed to a prepositioning unit. No matter which type the product concerned may be, the block sealing member 8 of the product (assembled product 2) is brought into contact with the substrate holding jig 12 and therefore the product is set beforehand in a state in which the block sealing member 8 side faces down.

Products (assembled products 2) received in the second rack are LGA (Land Grid Array) type products free of ball electrodes 11. They are lifted to an upper portion of the rack by means of an elevator and are chucked and conveyed successively from the top one.

It is necessary that the product thus chucked and conveyed from each loader be mounted on the substrate holding jig 12 with a certain degree of accuracy. Therefore, the product is once established its position by a positioning unit (step S1 in FIG. 35). For this positioning there is adopted a method wherein vacuum chucking of the conveyance unit is once released, allowing the product to fall by its own weight into a pocket having a contour matching the contour of the product, and then the product is again chucked. This is an inexpensive positioning method.

Thereafter, a jig product setting of step S2 in FIG. 35 is performed.

First, the product (assembled product 2) which has been positioned by the above positioning method is chucked by a jig transfer hand 14 as shown in FIG. 11 and is set to the substrate holding jig 12 which has been positioned in advance. At this time, the jig transfer hand 14 is positioned relative to the substrate holding jig 12 while being guided by positioning pins or the like.

The jig transfer hand 14 is made up of a hand body 14a and a sponge 14b.

Subsequently, as shown in FIG. 12, the substrate surface 7c (the back surface 3b of the individual substrate 3) as an external terminal mounting surface of the matrix substrate 7 in the assembled product 2 is brought into contact with the sponge 14b of the jig transfer hand 14 and the assembled product 2 is sandwiched and clamped by both the jig transfer hand 14 and the substrate holding jig 12.

The assembled product 2 thus clamped is conveyed in the clamped state to the next processing step.

Subsequently, there is performed setting to a dicer cutting stage which is shown in step S3.

More specifically, the assembled product 2 and the substrate holding jig 12 are set to a dicer cutting stage 15 by the jig transfer hand 14. At this time, the dicer cutting stage 15 and the substrate holding jig 12 clamped by the jig transfer hand 14 are positioned using guide pins or the like.

For checking whether the substrate holding jig 12 and the assembled product 2 are present or not on the dicer cutting stage 15, as shown in FIG. 13, the same stage has a jig chucking hole 15b for chucking only the substrate holding jig 12 and a product chucking hole 15a for chucking the product on the jig.

In the substrate holding 12 shown in FIG. 9 there are formed chucking holes (through holes) 12c corresponding respectively to the device areas 7a on the matrix substrate 7 shown in FIG. 5. When the block sealing member 8 in the assembled product 2 is to be chucked, it can be vacuum-chucked through the chucking holes 12c corresponding to the device areas 7a respectively.

Thus, when the block sealing member 8 is to be vacuum-chucked through the substrate holding jig 12, it is possible to vacuum-chuck both the substrate holding jig 12 and the block sealing member 8 by vacuum evacuation from separate exhaust paths (indicating the product chucking hole 15a and the jig chucking hole 15b) corresponding respectively to the substrate holding jig and the block sealing member.

By utilizing such chucking holes it is possible to judge various states, for example, judge that there is no jig, that there is a jig but there is no product, and that both jig and product are present.

For delivery of the substrate holding jig 12 and the assembled product 2 from the jig transfer hand 14 to the dicer cutting stage 15, the product and jig chucking operation on the stage side is started, and after a vacuum sensor on the stage side has detected a level of a predetermined value, the product chucking operation of the jig transfer hand 14 is cancelled, then the clamped state by the jig is released, and the jig transfer hand 14 is retracted to a position not obstructing the dicing operation.

Subsequently, there is performed dicing into individual pieces after dicer recognition which is shown in step S4.

To be more specific, the block sealing member 8 and the matrix substrate 7 are diced along the dicing lines 7b while a surface 8a of the block sealing member 8 in the assembled product 2 is vacuum-chucked by the dicer cutting stage 15 through the substrate holding jig 12, whereby a division is made into individual device areas 7a (division into individual pieces).

In this case, after the assembled product 2 has been set onto the dicer cutting stage 15 through the substrate holding jig 12, a wiring pattern formed on the substrate surface 7c of the matrix substrate 7 in the assembled product 2 is recognized by a recognition camera provided in the dicer and a cutting position is calculated.

After completion of the recognition, the division of the assembled product 2 into individual pieces is started in accordance with a numerical value calculated on the basis of the recognition information.

Dicing of the assembled product 2 is carried out in the following manner As shown in FIGS. 14 and 15, a dicing blade 10 is moved ahead from the substrate surface (back surface) 7c side of the matrix substrate 7 with plural ball electrodes 11 as external terminals mounted on the substrate surface (back surface) 7c, and the blade 10 is moved repeatedly in both transverse and longitudinal directions of the matrix substrate 7 to dice the block sealing member 8 and the matrix substrate 7.

As a result, the block sealing member 8 is divided into individual sealing members 6 and the matrix substrate 7 is divided into individual substrates 3.

Thus, in the semiconductor device manufacturing method of this first embodiment, at the time of dividing the matrix substrate after block molding, the block sealing member 8 and the matrix substrate 7 are diced while vacuum-chucking the surface 8a of the block sealing member 8, whereby the division can be done without imposing any stress on the substrate surface (back surface) 7c as an external terminal mounting surface of the matrix substrate 7.

Thus, the back surface 3b (substrate surface 7c) of each individual substrate 3 can be prevented from being flawed.

Moreover, since the surface 8a of the block sealing member B is easier to be vacuum-chucked than the matrix substrate 7, it is possible to hold the block sealing member 8 and the matrix substrate 7 positively while ensuring stabilization of the chucking condition, and hence possible to enhance the dicing accuracy and reliability.

Further, since the surface 8a of the block sealing member 8 is vacuum-chucked, the substrate surface 7c of the matrix substrate 7 faces up, so that it becomes easier to recognize a wiring pattern and the like, with the result that the recognition of a dicing position (dividing position) can be done easily.

After completion of the cutting into individual pieces, there is performed setting to a washing/drying stage as shown in step S5.

In this step there is made conveyance of the assembled product 2 and the substrate holding jig 12 using another jig transfer hand 14 which is twinned with the jig transfer hand 14 described above.

Thus, in the dicing/decontaminating equipment used in this first embodiment, the jig transfer hand 14 described previously and the other jig transfer hand 14 just referred to above are used in a pair. After the other transfer hand 14 has taken out diced individual products from the dicer cutting stage 15, the undiced assembled product preset to one jig transfer hand 14 is set to the dicer cutting stage 15, so that it is possible to shorten the processing wait time of each hand and hence possible to improve the working efficiency of the equipment.

Washing which is conducted at this stage aims at removing cutting wastes (contamination) resulting from dicing. The assembled product 2 having been diced into individual pieces and held by the other jig transfer hand 14, as well as the substrate holding jig 12, are set to a spin stage 16 for washing and drying. The setting is carried out in the same way as is the case with the dicer cutting stage 15. The diced, assembled product 2 on the substrate holding jig 12 is held by the other jig transfer hand 14 and is conveyed onto the spin stage 16 for washing and drying in the next step while being clamped between the other transfer jig 14 and the substrate holding jig 12.

At this time, on the other transfer hand 14 side, the substrate holding jig 12 and the hand body 14a are established their positions using guide pins or the like and the assembled product after dicing is vacuum-chucked and fixed on the dicer cutting stage. In this state the substrate surface 7c side of the matrix substrate 7 is pressed down with sponge 14b of a material which does not cause damage to the ball electrodes 11. Thereafter, the substrate holding jig 12 is clamped.

Thereafter, the dicer cutting stage 15 is released from its vacuum chucking state and the diced, assembled product 2 is conveyed onto the spin stage 16 while being fixed so as not to move on the substrate holding jig 12.

Subsequently, washing and drying are carried out in step S6.

In the spin stage 16, as shown in FIG. 16, washing water 16b held at a high pressure is injected from above the diced, assembled product 2 while the product is chucked by a jig/product chucking hole 16a through the substrate holding jig 12, causing the spin stage 16 to rotate, thereby improving the washing power. After the washing, high pressure air 16c is injected from above the assembled product 2, also causing rotation of the spin stage 16 to dry the product (assembled product 2).

The contamination removed by washing and drying in this first embodiment is one deposited on the substrate surface 7c of the matrix substrate 7 located at an upper portion of the product, and at this time there remains contamination on the surface 8a of the block sealing member 8. In case of removing this remaining contamination in a later step, the removal is relatively easy. However, the removal of contamination from the substrate surface 7c is not easy particularly when ball electrodes 11 are provided on the substrate surface.

According to the method of this first embodiment wherein the surface 8a of the block sealing member 8 faces down and is chucked by the substrate holding means 12, the surface 7c of the matrix substrate 7 can be washed and dried while facing up and mounted on the substrate holding jig 12. Therefore, it is possible to easily remove cutting wastes adhered to the substrate surface 7c as an external terminal mounting surface of the matrix substrate 7. Thus, also in washing the substrate surface 7c, this method is very advantageous in comparison with the method wherein chucking is performed with the substrate surface 7c facing down.

After the washing and drying step, there is performed inversion as in step S7.

First, the assembled product 2 after washing and drying is transferred together with the substrate holding jig 12 onto an inverting hand 17 shown in FIG. 17 by means of one jig transfer hand 14. The operation for taking out the assembled product 2 and the substrate holding jig 12 from the spin stage 16 is the same as is the case with the dicer cutting stage 15, and guide pins or the like are used also when the jig transfer hand 14 sets the assembled product 2 and the substrate holding jig 12 onto the inverting hand 17.

The inverting hand 17 is provided with a hand body 17a and a motor 17c for turning the hand body 17a upside down and has a four-axis freedom of X, Y, Z, and Θ. Further, the hand body 17b is formed with an aperture 17b for chucking the assembled product 2 through the substrate holding jig 12.

The inverting hand 17 chucks only the product (assembled product 2) and a mechanical clamp is used for fixing the substrate holding jig 12, whereby it is possible to simplify the vacuum evacuation path and reduce the cost of the inverting hand 17.

A description will be given below about a drainer hand 18.

The drainer hand 18 is for once separating the assembled product 2 from the substrate holding jig 12 and chucking only the assembled product 2. The drainer hand 18 is provided with a hand body 18a, a chucking aperture 18b formed in the hand body 18a, a sponge 18c disposed in the hand body 18a, and plural through holes 18d which are formed in the sponge 18c in a one-to-one correspondence to individual products.

As shown in FIGS. 17 and 18, the purpose of transferring the assembled product from the inverting hand 17 to the drainer hand 18 is to remove water remaining on the surface 8a of the block sealing member 8 in the assembled product 2, thereby preventing water drops from lapping on the substrate surface 7c upon inversion of the assembled product 2, and to clean the substrate holding jig 12.

The assembled product 2 which has been transferred together with the substrate holding jig 12 onto the inverting hand 17 is chucked by the inverting hand 17 through the aperture 17b. In this state, the drainer hand 18 is disposed above the inverting hand 17 and thereafter the inverting hand 17 is moved upward, causing the assembled product 2 to be pressed against the sponge 18c of the drainer hand 18 from below.

Subsequently, chucking is started through the through holes 18d formed in the sponge 18c of the drainer hand 18 and then the chucking in the inverting hand 17 is stopped. At this time, since plural through holes 18d are formed in the sponge 18c in a one-to-one correspondence respectively to the products, the substrate surface 7c of the matrix substrate (see FIG. 15) in the assembled product 2 can be chucked by the drainer hand 18, as shown in FIG. 18.

Although plural ball electrodes 11 are mounted to the substrate surface 7c, since it is the sponge 18c with which the substrate surface 7c is brought into contact, the substrate surface 7c can be chucked without flawing the ball electrodes 11.

Then, after making it sure by a vacuum sensor that the delivery of product has been completed, the inverting hand 17 is brought down, and thus a positional deviation of product can be prevented.

Now, the product chucking by drainer hand shown in step S8 is over.

Figure 36:
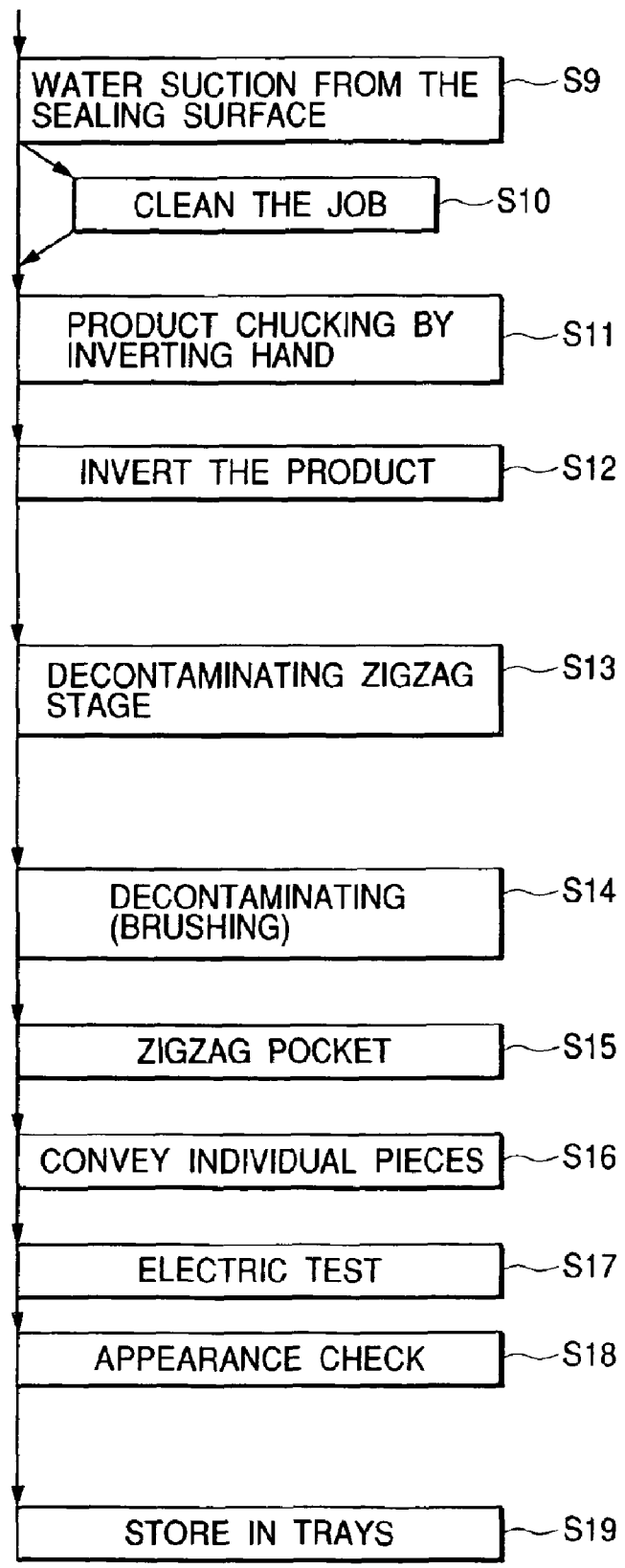
FIG. 36 is a manufacturing process flow chart showing a part of the procedural example referred to in FIG. 35.

Thereafter, there is performed water suction from the sealing surface of step S9 which is shown in FIG. 36.

In this step, the substrate surface 7c of the matrix substrate 7 with ball electrodes 11 attached thereto is chucked by the drainer hand 18 through sponge 18c, and in this state a suction sponge 23a is pushed against the surface 8a of the block sealing member 8 to suck water form the surface 8a.

More specifically, as shown in FIG. 19, a suction stage 23 provided with a suction sponge 23a is disposed below the drainer hand 18, then the suction stage 23 is raised to push the suction sponge 23a against the surface 8a of the block sealing member 8, and suction is made through a suction hole 23b formed in the suction stage 23 to suck water adhered to the block sealing member 8.

In this way it is possible to prevent water drops from lapping on the substrate surface 7c upon product inversion.

On the other hand, jig cleaning of step S10 is performed concurrently with step S9.

In this step, the inverting band 17 is inverted so that the substrate holding jig 12 faces down. Further, as shown in FIG. 20, a jig cleaning stage 24 is disposed below the inverting hand 17, thereafter the jig cleaning stage 24 and the inverting hand 17 are brought into close contact with each other and air blow 24a is applied to the substrate holding jig 12 within a hermetically sealed space. At the same time, suction is made through a dust collection hole 24b formed in the jig cleaning stage 24 to decontaminate the substrate holding jig 12.

As a result, water and cutting wastes (e.g., broken pieces of product, cut chips of sealing resin, and contamination) on the substrate holding jig 12 can be prevented from being re-adhered to the product.

Subsequently, product chucking by the inverting hand is performed, as shown in step S11.

More specifically, a shown in FIG. 21, the assembled product 2 is again chucked onto the substrate holding jig 12 in the inverting hand 17 in such a manner that its substrate surface 7c faces up.

Thereafter, the product is inverted as in step S12. As shown in FIG. 22, the inverting hand 17 is inverted while the assembled product 2 is chucked through the substrate holding jig 12, thereby allowing the substrate surface 7c in the assembled product 2 to face down.

Then, a decontaminating zigzag stage is used as in step S13.

First, as shown in FIG. 23, a decontaminating zigzag stage (zigzag stage) 25 provided with sponge 25a is disposed below the inverting hand 17 which chucks the assembled product 2 with the substrate surface 7c facing down, then the inverting hand 17 is brought down while chucking the assembled product 2, and the assembled product 2 is delivered onto the sponge 25a of the decontaminating zigzag stage 25.

At this time, the assembled product 2 already diced is separated into individual products (BGA 9) and then the individual products are arranged zigzag on the decontaminating zigzag stage 25.

That the products are arranged zigzag is for the following reason.

First, at the time of performing decontamination as shown in FIG. 27, spaces are formed along the four sides of each product by zigzag arrangement, whereby brushing reaches the four side faces of individual sealing members 4 and hence the decontamination range can be set wide.

Secondly, in the case where products are chucked all together in the dicer cut state on the decontaminating zigzag stage 25, and when individual products are conveyed in the next step after the end of decontamination, if one or plural individual products are conveyed directly at a time, there occurs vacuum leak at unloaded empty portions resulting from the individual product conveyance on the decontaminating zigzag stage 25, with consequent lowering of the degree of vacuum in block chucking and occurrence of a positional deviation of product on the decontaminating zigzag stage 25.

For this reason, it is not preferable to perform the individual product conveyance directly from the decontaminating zigzag stage 25. It is necessary to once transfer individual products from the decontaminating zigzag stage 25 onto a tray not causing vacuum leak (in the case of such a tray it is not necessary to effect vacuum chucking).

In this case, for improving the throughput in the transfer, it is preferable that the individual products be transferred all together onto the tray. However, the product transfer accuracy into tray pockets is less strict in the case of zigzag pockets which permit guiding the four sides of each product than in the shape of a single assembly in the dicer cut state, thus facilitating the product transfer work.

For example, when the spacing between adjacent individual products is only the width (for example, 0.2 mm) of the dicing blade 10, it is extremely difficult, with any other arrangement than zigzag arrangement, to form pockets each for guiding the four sides of product.

For the above first and second reasons, individual products are taken out from the assembled product 2 which has been subjected to dicing, and are arranged zigzag on the decontaminating zigzag stage 25.

Next, the following description is provided about in what manner the diced individual products with the substrate held by the inverting hand 17 shown in FIG. 23 are arranged zigzag on the decontaminating zigzag stage 25.

For arranging the diced individual products (BAA 9) in a zigzag fashion, all the products are vacuum-chucked beforehand by vacuum evacuation systems of plural different paths in the inverting hand 17, thereafter the vacuum evacuation in any of the plural paths is stopped selectively and the products corresponding to the path concerned are transferred onto the decontaminating zigzag stage (zigzag stage) 25. This is repeated successively for each of the paths to arrange the products zigzag on the decontaminating zigzag stage 25.

For example, in the case where vacuum evacuation systems of four, first to fourth different types of paths are provided for forming a zigzag arrangement in the inverting hand 17, first vacuum evacuation of only the first evacuation system is stopped and only the products present at the position corresponding to the first vacuum evacuation system are chucked and transferred onto the decontaminating zigzag stage 25. This state is shown in FIG. 24.

Subsequently, vacuum evacuation of only the second vacuum evacuation system is stopped and only the products present at the position corresponding to the second vacuum evacuation system are chucked and transferred onto the decontaminating zigzag stage 25. This state is shown in FIG. 25.

In this way the products are successively transferred onto the decontaminating zigzag stage 25, on which all the products are chucked in zigzag arrangement.

As shown in FIG. 26, a sponge 25a is provided on the decontaminating zigzag stage 25 and through holes 25c are formed in the sponge 25a in one-to-one correspondence respectively to the zigzag-arranged products.

In the decontaminating zigzag stage 25, therefore, upon vacuum evacuation from an aperture 25b, the back surfaces of the zigzag-arranged products can be chucked through the through holes 25c formed in the sponge 25a. In this state, the back surface 3b of the individual substrate 3 in each product (BGA 9) is vacuum-chucked and the surface 8a of each sealing member 6 faces upward.

Thereafter, decontamination is performed in step S14.

In this step, as shown in FIG. 27, a rotatable brush 26 is rotated, whereby the back surfaces 3b of the individual substrates 3 with plural ball electrodes 11 mounted thereon rub the surfaces 8a of the sealing members 6 of the individual zigzagged and chucked BGAs 9.

In this case, the surfaces 8a of the individual sealing members 6 have been dried by the sealing surface water suction in step S9 and thus the dried surfaces 8a can be rubbed with the brush 26, so that contamination such as resin wastes can be removed positively. Such contamination as resin wastes generated in the dicing step is easier to be removed if the surfaces 8a of the individual sealing members 6 are dried. In the decontaminating step adopted in this first embodiment, the sealing member surfaces 8a are faced upward and are rubbed with the brush 26, thus permitting positive removal of contamination.

At the time of rubbing the sealing members 6 with the brush 26, it is optional whether the brush 26 which is rotating is to be moved along the zigzagged sealing members 6 or the decontaminating zigzag stage 25 is to be moved, or both may be moved.

Moreover, since the BGAs 9 are zigzagged on the decontaminating zigzag stage 25, the brush 26 which is rotating can also be brought into contact with the four side faces of each individual sealing member 6, whereby the four side faces can be decontaminated.

Thus, according to the decontaminating step adopted in this first embodiment, it is possible to eliminate contamination adhered to nearly the whole of each individual sealing member 6, including the four side faces and the surface 8a.

For antistatic purpose it is preferable that the brush 26 be formed using an electrically conductive material.

During the decontaminating work with the brush 26, contamination scatters around, but by vacuum evacuation from the aperture 25b formed in the decontaminating zigzag stage 25 to collect the scattered contamination it is possible to prevent the scattering of contamination.

Thereafter, the products are transferred into zigzag pockets in step S15.

In this step, a zigzag pocket tray (tray) 28 with pockets formed zigzag is provided in advance and the BGAs 9 after decontamination are once transferred onto the zigzag pocket tray 28 while being chucked all together in their zigzagged state and are received the BGAs 9 respectively in zigzag pockets 28a formed in the zigzag pocket tray 28.

In this case, the plural BGAs 9 on the decontaminating zigzag stage 25 shown in FIG. 28 are chucked all together at the surfaces 8a of the respective sealing members 6 by means of a zigzag block chucking hand 27 which can chuck all the BGAs together in a zigzagged state, and are transferred onto the zigzag pocket tray 28 shown in FIGS. 29 and 30.

Since the plural BGAs 9 can thus be transferred all together, it is possible to improve the throughput of the transfer.

It is preferable that the zigzag pockets 28a formed in the zigzag pocket tray 28 be each provided with guides correspondingly to the four sides of each product.

Thereafter, individual products are conveyed in step S16.

In this step, as shown in FIG. 31, one or plural BGAs 9 are taken out from the zigzag pocket tray 28 and are conveyed.

In this individual product conveyance, since BGA 9 is accommodated in each pocket, there is no fear of occurrence of vacuum leak even if there occur empty pockets after pickup of one or plural BGAs 9.

In the conveyance being considered, therefore, a desired number (for example, four) of BGAs 9 are chucked at the surfaces 8a of the respective sealing members 6 and are picked up by means of an individual product chucking hand 29, then are conveyed to such positioning pockets 30 as shown in FIGS. 32 and 33, or to a test section or an appearance checking section, in accordance with a preset program.

For example, in case of conducting an electric test in step S17, as shown in FIG. 32, the products (BGAs 9) which have been conveyed by a first individual product chucking hand 29a are received, for delivery to a second individual product chucking hand 29b, into positioning pockets 30 which also serve to provide temporary storage places. Subsequently, the products are chucked by the second individual product chucking hand 29b and are inserted into testing sockets 31, followed by an electric test with a tester connected electrically to each socket. The products which have gone through the test are then conveyed to the next step by means of a third individual product chucking hand 29c.

The second individual product chucking hand 29b inserts products into the testing sockets 31 and at the same time the third individual product chucking hand 29c takes out products from the testing sockets 31, whereby the processing capacity can be improved.

In an appearance check of step S18, a dimensional accuracy (distance of each of the four sides from a reference position) after dicing is measured to prevent a defective product not conforming to the specification tolerance from flowing to the next step, also preventing defects caused by the dicer from being implanted in the products concerned Further, a check is made as to whether there is any drop-out of ball, thereby preventing the flow of a defective product to the next step.

An appearance checking apparatus used is of a specification which permits the addition of checking items (e.g., the adhesion of dust particle).

For shortening the time required for appearance check, as shown in FIG. 33, products are conveyed up to a position above an appearance checking camera 32 while being chucked by a fourth individual product chucking hand 29d and are checked for appearance there by the camera 32.

In a tray storing step S19 the products, by means of the fourth individual product chucking hand 29d, are conveyed and stored onto trays which are classified depending on whether the products are good, defective in the test, or defective in appearance.

To be more specific, in a tray storing section there are provided three types of trays which are a good product receiving tray 33, a test defect product receiving tray 34, and an appearance defect product receiving tray 35. The tray storing section is composed of a tray loader, a product storing unit, and a tray unloader. In the event a certain number of test defects makes it impossible to ensure a predetermined yield, the dicing/decontaminating equipment fulfills an automatic re-checking function. In this case, the aforesaid classification of trays into three types becomes as follows: the good product receiving tray 33, a primary test/appearance defect tray, and a secondary test/appearance defect tray.

Next, a description will be given below about a substrate holding jig 12 and a jig transfer band 14 each according to a modification of the first embodiment.

Figure 37:
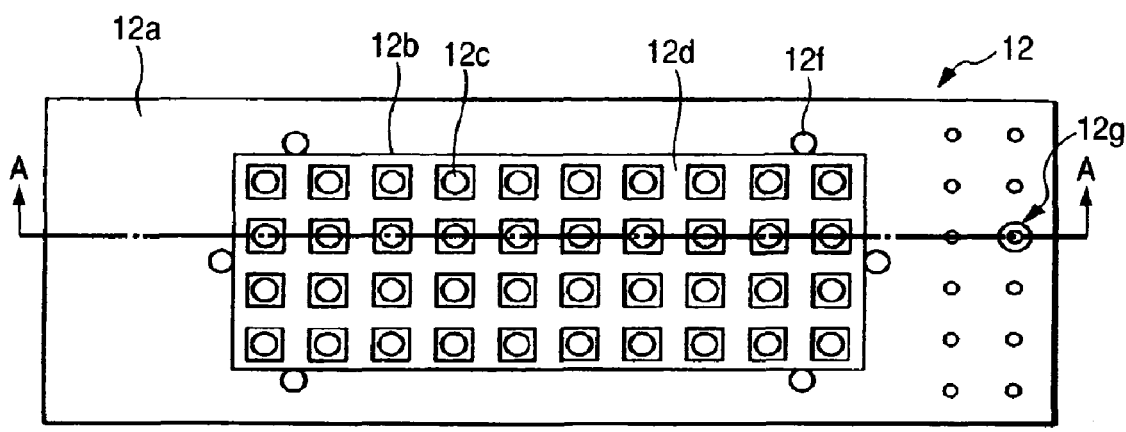
FIG. 37 is a plan view showing the structure of a substrate holding jig according to a modification of the first embodiment.
Figure 38:
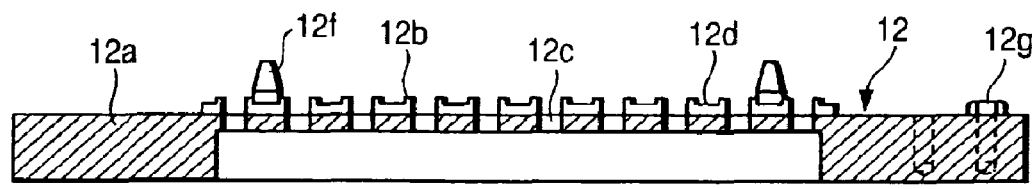
FIG. 38 is a sectional view thereof.
Figure 39:
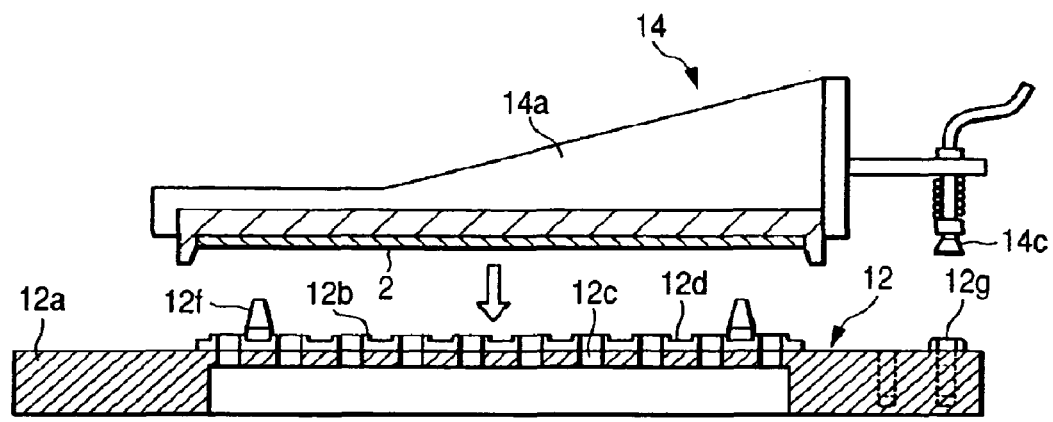
FIG. 39 is a sectional view showing how to clamp an assembled product by both the substrate holding jig according to the modification illustrated in FIG. 37 and a jig transfer hand also used in the modification.
Figure 40:
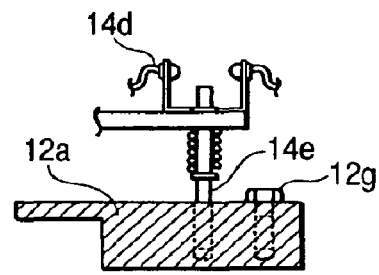
FIG. 40 is an enlarged, partial sectional view showing a clamped, sensor OFF state in the jig transfer hand according to the modification illustrated in FIG. 39.
Figure 41:
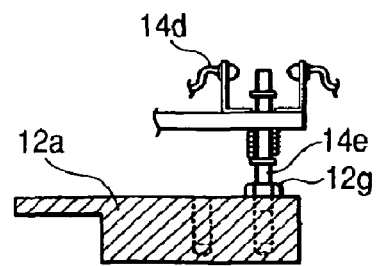
FIG. 41 is an enlarged, partial sectional view showing a clamped, sensor ON state in the jig transfer hand according to the modification illustrated in FIG. 39.

FIG. 37 is a plan view showing the structure of a substrate holding jig according to a modification of the first embodiment, FIG. 38 is a sectional view thereof, FIG. 39 is a sectional view showing how to clamp an assembled product by both the substrate holding jig according to the modification illustrated in FIG. 37 and a jig transfer hand also used in the modification, FIG. 40 is an enlarged, partial sectional view showing a clamped, sensor OFF state in the jig transfer hand according to the modification illustrated in FIG. 39, and FIG. 41 is an enlarged, partial sectional view showing a clamped, sensor ON state in the jig transfer hand according to the modification illustrated in FIG. 39.

The substrate holding jig 12 according to the modification shown in FIGS. 37 and 38 is almost the same as the substrate holding jig shown in FIG. 9, but is provided in addition to the jig body 12*a* and the product support portions 12*b* with guide pins 12*f* for guiding an assembled product 2 shown in FIG. 39 and a projecting member 12*g* such as a hexagon headed bolt to be used for the recognition of jig.

The jig transfer hand 14 according to the modification shown in FIG. 39 is provided in addition to its components shown in FIG. 11 with a chucking pad 14*c* for recognizing the projecting member 12*g* of the substrate holding jig 12 shown in FIG. 38.

For the recognition of jig, the jig transfer hand 14 moves up to above the projecting member 12*g* of the jig applied and the projecting member 12*g* moves down to a predetermined height, in accordance with preset type data. Thereafter, a vacuum sensor is operated and if the vacuum sensor turns ON, this state is judged to be normal, while if its does not turn ON, this state is judged to be abnormal.

With the above operation, in case of using the substrate holding jig 12 and the jig transfer hand 14 according to this modification, it is possible to check whether the product to be cut and the jig used match each other, whereby it is possible to prevent the use of jig which does not match the product to be cut.

In FIGS. 40 and 41, the recognition of jig is performed using an optical sensor 14*d*. For example, if the projecting member 12*g* is not provided in the substrate holding jig 12, a pin member 14*e* does not shield the optical sensor 14*d*, while if the projecting member 12*g* is provided, the pin member 14*e* is pushed up and shields the optical sensor 14*d*.

In accordance with turning ON or OFF of the optical sensor 14*d* it is checked whether the product to be cut and the jig used match each other or not.

Second Embodiment

Figure 42:
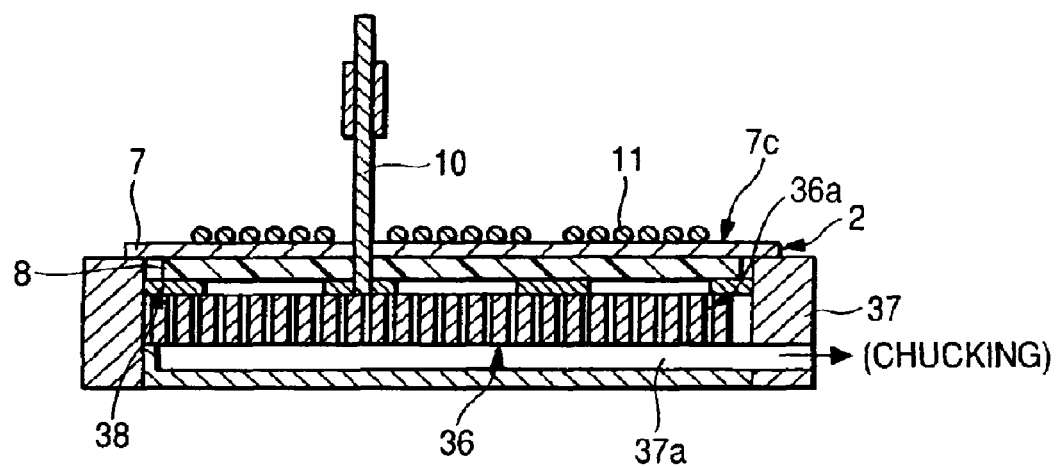
FIG. 42 is a sectional view showing an example of a state in which a substrate is held by a porous jig used in a semiconductor device manufacturing method according to a second embodiment of the present invention.
Figure 43:
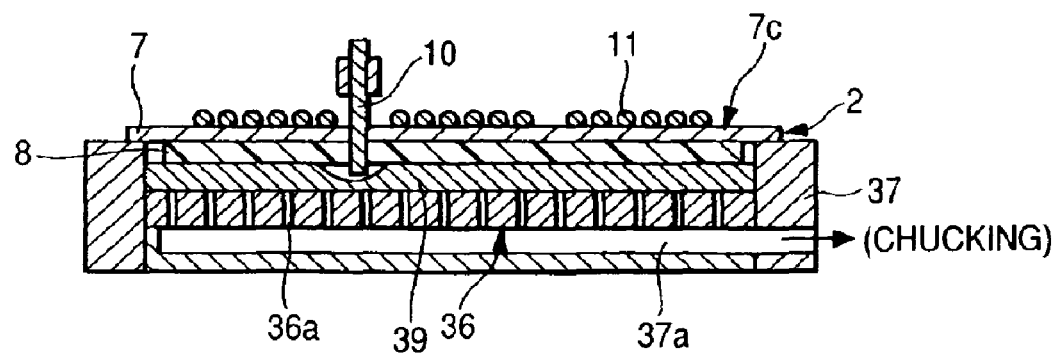
FIG. 43 is a sectional view showing a state where a substrate is held according to a modification of the second embodiment.
Figure 44:
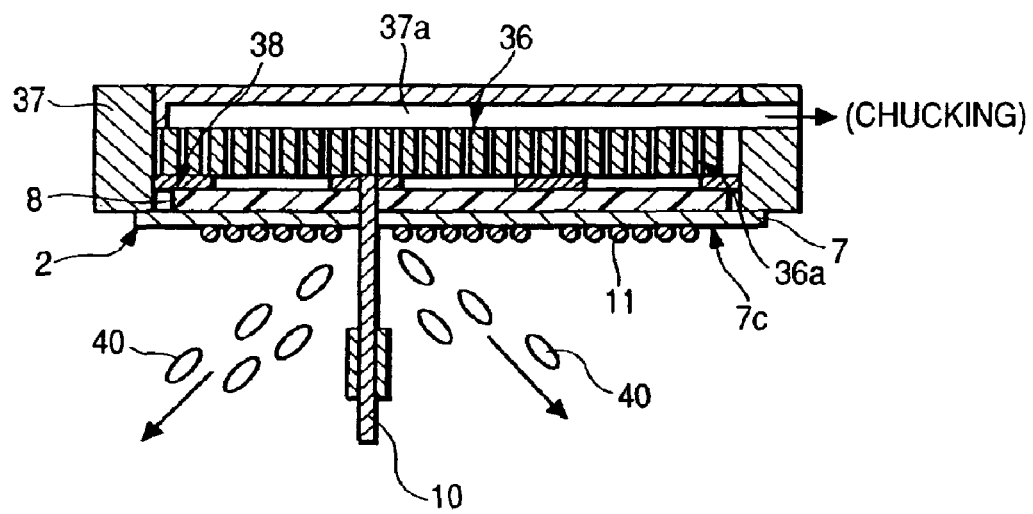
FIG. 44 is a sectional view showing a dicing method according to another modification of the second embodiment.
Figure 45:
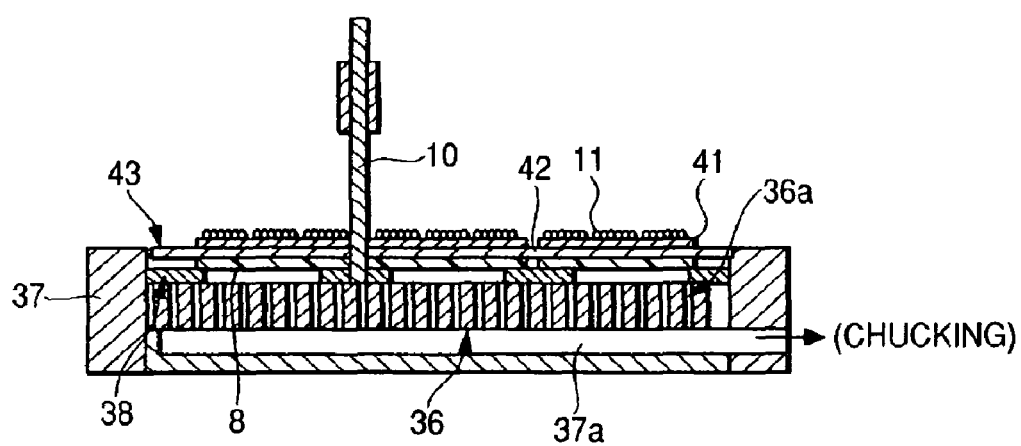
FIG. 45 is a sectional view showing an assembled product holding state according to a further modification of the second embodiment.
Figure 46:
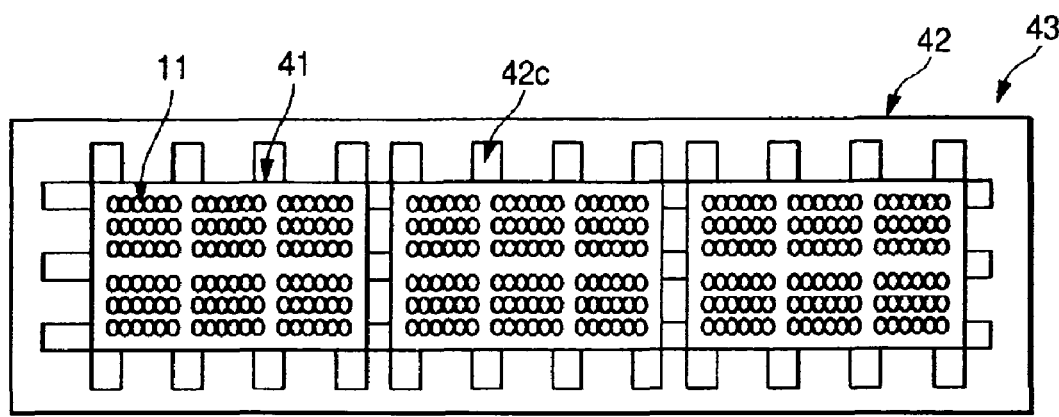
FIG. 46 is a plan view showing the structure of the assembled product according to the modification illustrated in FIG. 45.
Figure 47:
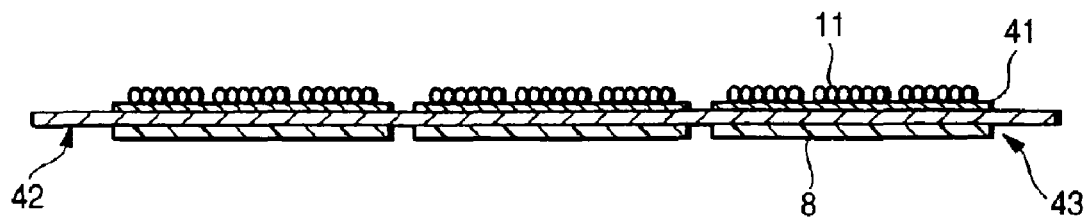
FIG. 47 is a sectional view thereof.
Figure 48:
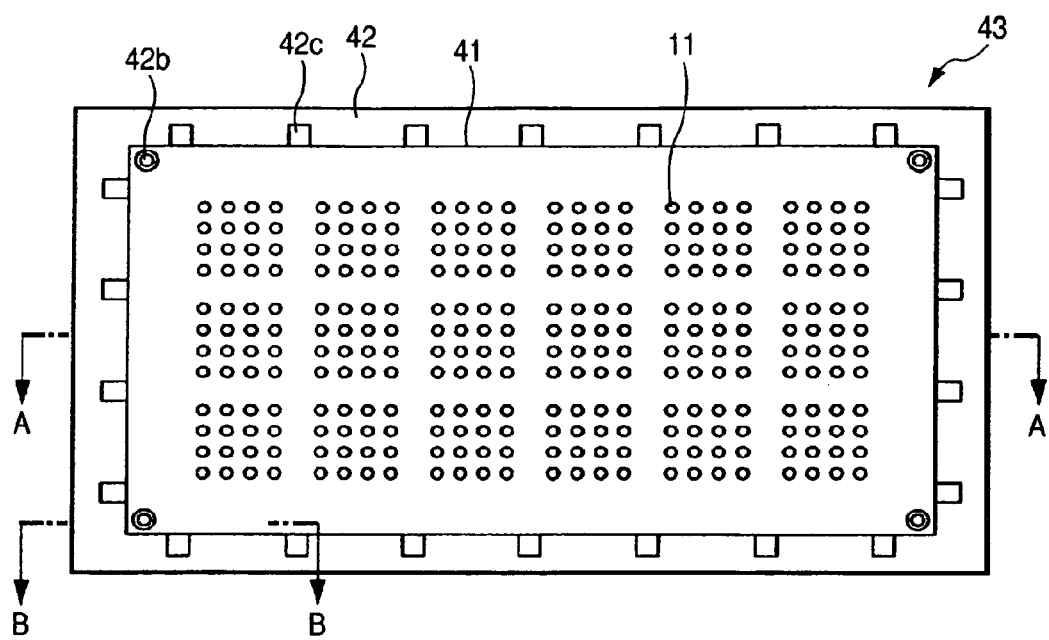
FIG. 48 is a plan view showing the structure of an assembled product according to a still further modification of the second embodiment.
Figure 49:
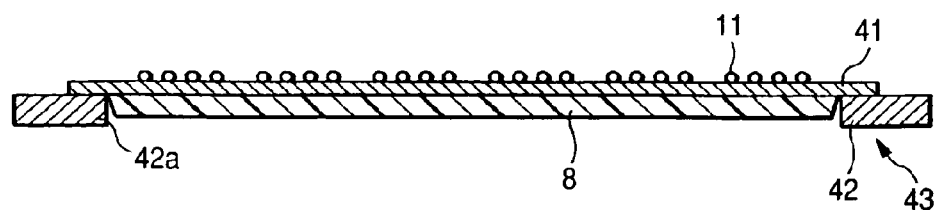
FIG. 49 is a sectional view showing a sectional structure taken along line A-A in FIG. 48.
Figure 50:
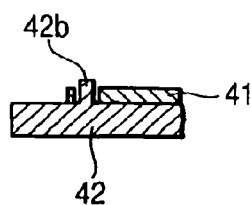
FIG. 50 is a partial sectional view showing a sectional structure taken along line B-B in FIG. 48.
Figure 51:
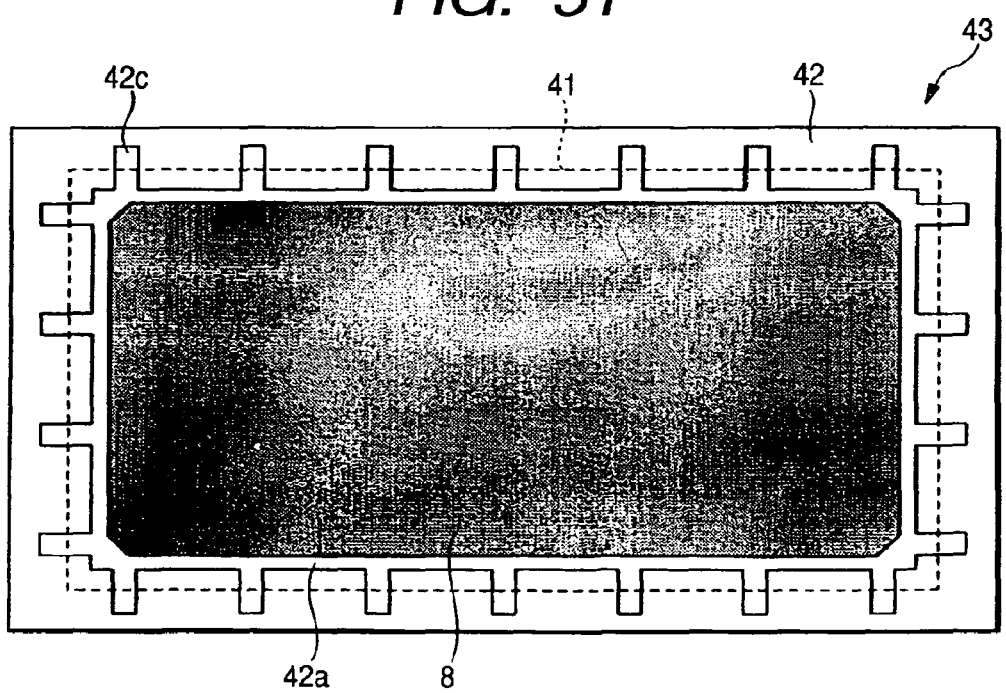
FIG. 51 is a back view showing a back side of the assembled product illustrated in FIG. 48.
Figure 52:
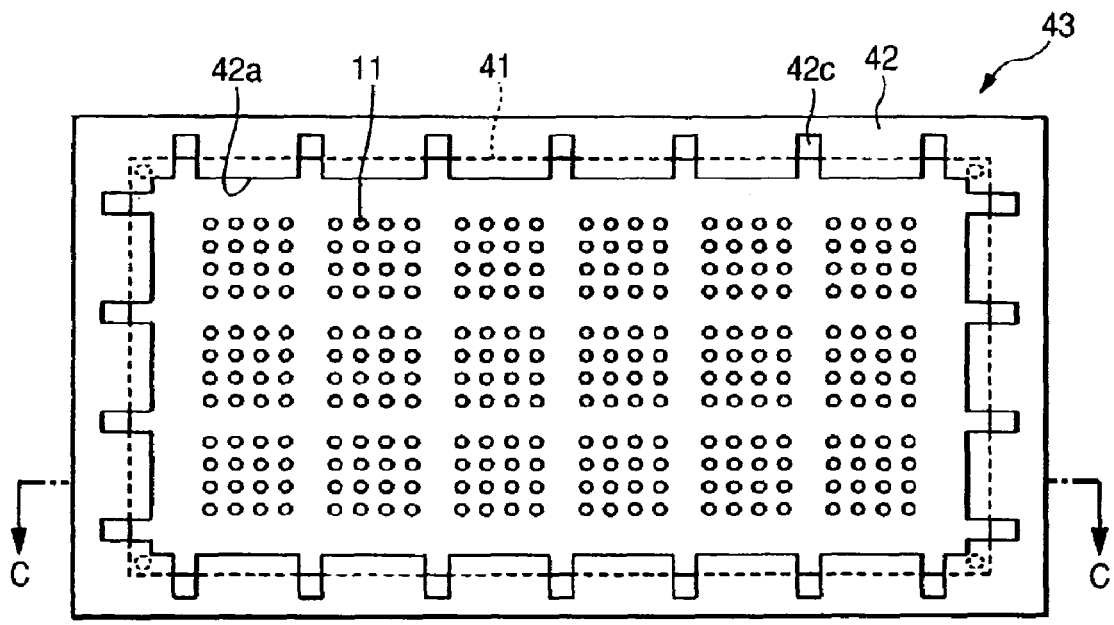
FIG. 52 is a plan view showing the structure of an assembled product according to a still further modification of the second embodiment.
Figure 53:
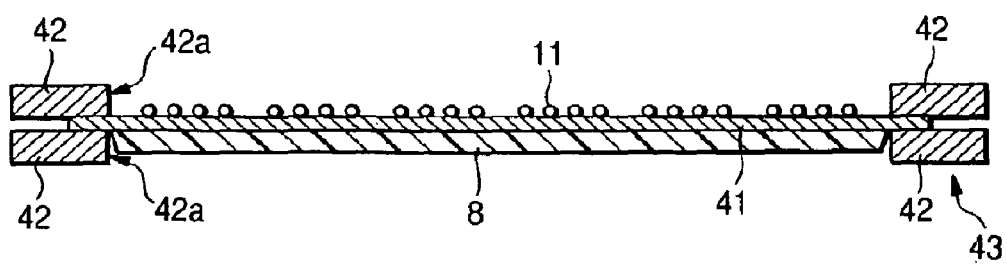
FIG. 53 is a sectional view showing a sectional structure taken along line C-C in FIG. 52.
Figure 54:
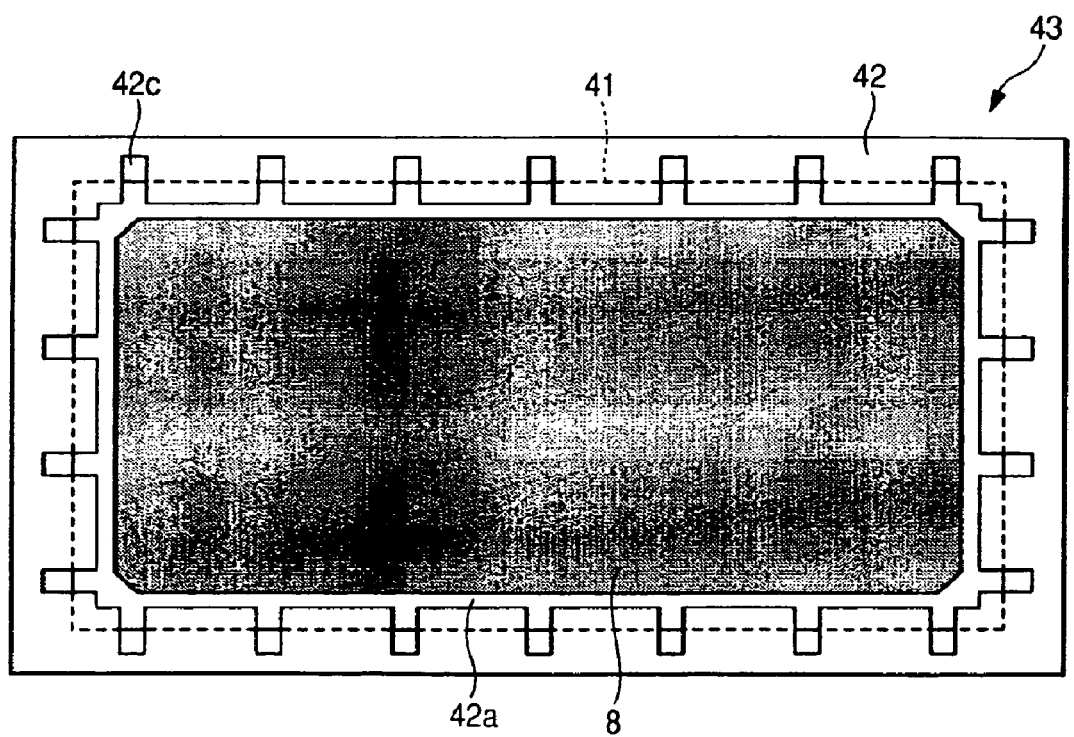
FIG. 54 is a back view showing a back side of the assembled product illustrated in FIG. 52.
Figure 55:
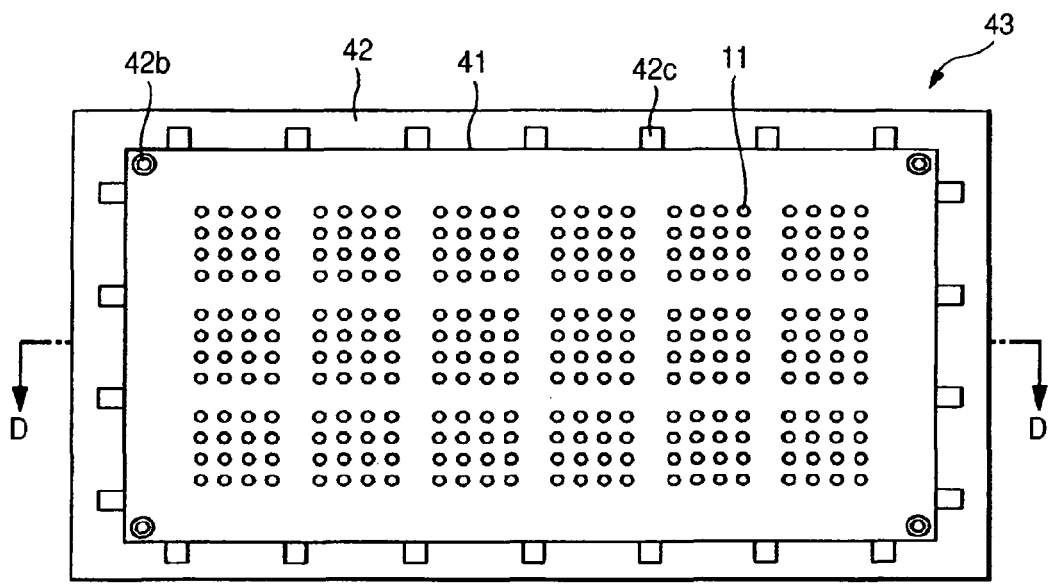
FIG. 55 is a plan view showing the structure of an assembled product according to a still further modification of the second embodiment.
Figure 56:
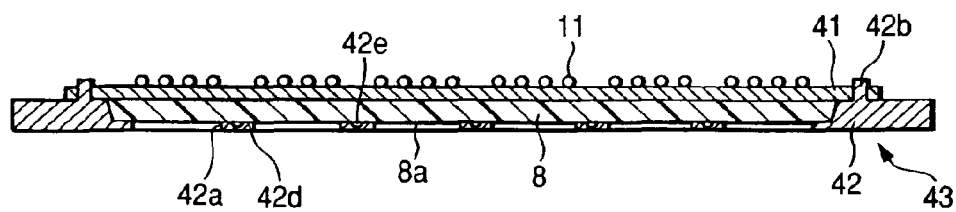
FIG. 56 is a sectional view showing a sectional structure taken along line D-D in FIG. 55.
Figure 57:
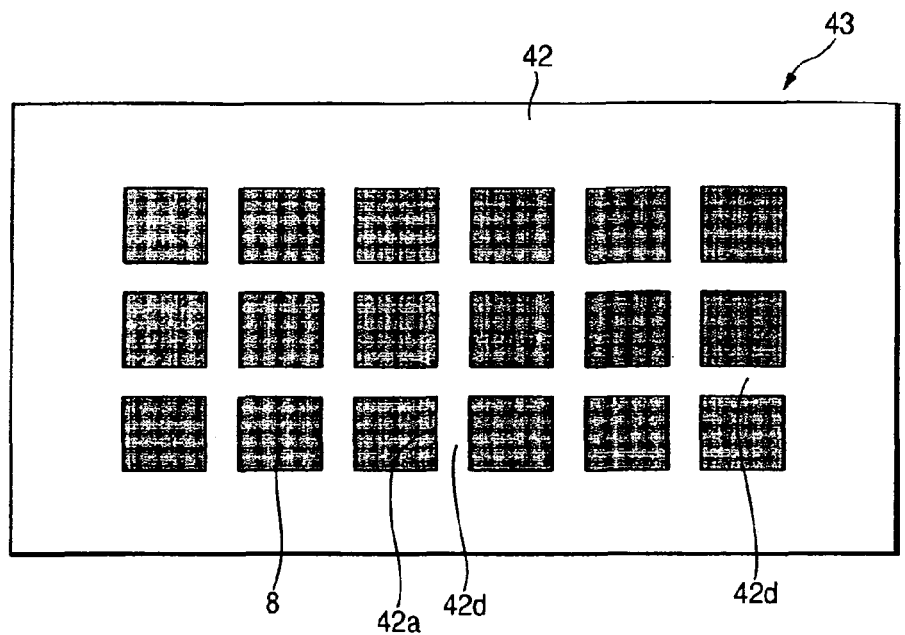
FIG. 57 is a back view showing a back side of the assembled product illustrated in FIG. 55.
Figure 58:
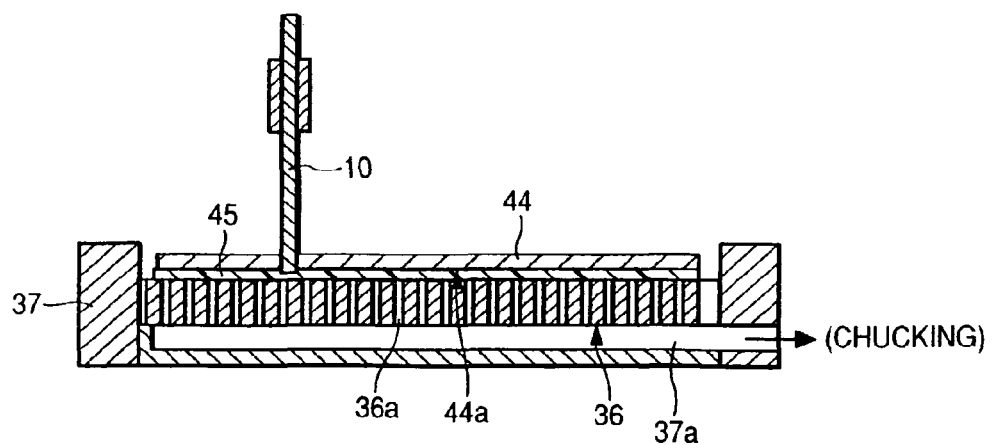
FIG. 58 is a sectional view showing a semiconductor device manufacturing method according to a still further modification of the second embodiment.

FIG. 42 is a sectional view showing an example of a state in which a substrate is held by a porous jig used in a semiconductor device manufacturing method according to a second embodiment of the present invention, FIG. 43 is a sectional view showing a state where a substrate is held according to a modification of the second embodiment, FIG. 44 is a sectional view showing a dicing method according to another modification of the second embodiment, FIG. 45 is a sectional view showing an assembled product holding state according to a further modification of the second embodiment, FIG. 46 is a plan view showing the structure of the assembled product according to the modification illustrated in FIG. 45, FIG. 47 is a sectional view thereof, FIG. 48 is a plan view showing the structure of an assembled product according to a still further modification of the second embodiment, FIG. 49 is a sectional view showing a sectional structure taken along line A-A in FIG. 48, FIG. 50 is a partial sectional view showing a sectional structure taken along line B-B in FIG. 48, FIG. 51 is a back view showing a back side of the assembled product illustrated in FIG. 48, FIG. 52 is a plan view showing the structure of an assembled product according to a still further modification of the second embodiment, FIG. 53 is a sectional view showing a sectional structure taken along line C-C in FIG. 52, FIG. 54 is a back view showing a back side of the assembled product illustrated in FIG. 52, FIG. 55 is a plan view showing the structure of an assembled product according to a still further modification of the second embodiment, FIG. 56 is a sectional view showing a sectional structure taken along line D-D in FIG. 55, FIG. 57 is a back view showing a back side of the assembled product illustrated in FIG. 55, and FIG. 58 is a sectional view showing a semiconductor device manufacturing method according to a still further modification of the second embodiment.

In this second embodiment, in connection with the manufacture of a semiconductor device, a description will be given about a jig used in dicing after block molding and a dicing method using the jig. A porous jig 36 having plural holes 36*a* is used instead of the substrate holding jig 12 used in the first embodiment.

As shown in FIG. 42, there is provided a support block 37 with a plate-like porous jig 36 built therein, the support block 37 being capable of holding an assembled product 2 after block molding. Dicing is performed on the support block 37 to divide the assembled product into individual products.

More specifically, onto the porous jig 36 built in the support block 37 and having plural holes 36*a* there is disposed the assembled product 2 through a low-adhesion sheet 38 in such a manner that a block sealing member 8 thereof faces toward the low-adhesion sheet 38.

In this way the assembled product 2 is disposed on the porous jig 36 through the low-adhesion sheet 38 with its block sealing member 8 facing toward the low-adhesion sheet 38.

In this state vacuum evacuation is made from a suction hole 37*a* formed in the support block 37 to vacuum-chuck the block sealing member 8 through the low-adhesion sheet 38 and the porous jig 36. Further, a blade 10 is advanced into a matrix substrate 7 from a substrate surface 7*c* side with ball electrodes 11 mounted thereto, and dicing is carried out with the blade 10 to divide the matrix substrate into individual substrates.

Plural holes 36*a* are formed throughout the whole surface of the porous jig 36, the holes 36*a* penetrating both surface and back surface of the porous jig almost uniformly. For example, the porous jig 36 is formed of a material capable of being produced by sintering or a metal.

Adhesive is applied to both surface and back of the low-adhesion sheet 38 and the advancing of the blade 10 is blocked by the same sheet.

By thus performing dicing with use of the porous jig 36 and the low-adhesion sheet 38, not only the adhesion of cutting chips to sealing members 6 can be prevented, but also it is possible to let the porous jig 36 cope with grade change by only replacement of the low-adhesion sheet 38. Thus, it is possible to let the porous jig 36 cope with various grades.

That is, both porous jig 36 and low-adhesion sheet 38 can be made to cope with not a single grade but various grades, whereby the versatility of the porous jig 36 is enhanced and the reduction of cost can be attained.

Unlike the conventional dicing tape having an ultraviolet-curing type adhesive, the low-adhesion sheet 38 can be used repeatedly, premising that the sheet is used with uniform adhesion not only during dicing step but also during subsequent pick-up step. As a result, it becomes possible to reduce the material cost in the dicing step.

Further, even when the assembled product 2 is warped, it is possible to prevent the occurrence of a chucking error for the assembled product because of the presence of the low-adhesion sheet 38.

However, the low-adhesion sheet 38 is not always needed.

Reference is now made to FIG. 43 which illustrates a modification from FIG. 42. In this modification there is used a soft resin sheet 39 in place of the low-adhesion sheet 38. Upon interference of the blade 10 with the soft resin sheet 39 in the dicing step, a soft resin (gellular) causes the sheet itself to escape, whereby the advancing of the blade 10 can be stopped.

Also as to the soft resin sheet 39, repeated use thereof in the dicing step permits reduction of the material cost. Besides, with use of a soft resin, it is possible to prevent damage of the soft resin sheet 39 during dicing and hence it is possible to increase the number of times of repeated use.

In the modification shown in FIG. 44, a surface 7c of a matrix substrate 7 with ball electrodes 11 mounted thereto is allowed to face downward, while a block sealing member 8 of an assembled product 2 is allowed to face upward, and the block sealing member 8 is chucked from an upper side thereof by the support block 37 through the porous jig 36 and the low-adhesion sheet 38. At the time of dicing, the dicing blade 10 is advanced from a lower side of the matrix substrate 7.

According to the modification shown in FIG. 44, since cutting chips 40 (contamination) produced during dicing directly drop downward and scatter, it is possible to minimize the adhesion thereof to the assembled product 2.

In the modification shown in FIG. 45, a tape substrate 41 is used as a wiring substrate. As shown in FIGS. 46 and 47, dicing is carried out in a state in which the assembled product 43 having the tape substrate 41 is affixed to a metallic frame member 42.

The tape substrate 41 is, for example, 100 μm or less in thickness and is thus very thin, that is, the rigidity thereof is low. For this reason, the rigidity of the tape substrate 41 is enhanced during dicing. A block sealing member 8 formed on the tape substrate 41 and the frame member 42 are chucked through the low-adhesion sheet 38 and the porous jig 36 and in this state there is performed dicing.

In this case, the step of peeling the tape substrate 41 from the frame member 42 is not needed and therefore it is possible to decrease the number of assembling steps.

FIGS. 48 to 57 illustrate various shapes of frame members 42 and fixing methods for tape substrates 41.

The frame member 42 shown in FIGS. 48 to 51 has a large window 42a which corresponds to a block sealing member 8 of a tape substrate 41, the block sealing member 8 being disposed in the window 42a. The tape substrate 41 and the frame member 42 are fixed with fixing pins 42b provided at four corners. The tape substrate 41 is held under tension by the fixing pins 42b. Further, outside and around the window 42a there are formed plural slits 42c for traveling escape of the blade 10 during dicing.

The frame member 42 shown in FIGS. 52 to 54 fix the tape substrate 41 from both surface and back side of the tape substrate in a sandwiching manner. For the fixing there is adopted, for example, a magnet fixing method or a pin fixing method.

The frame member 42 shown in FIGS. 55 to 57 has bars 42d for supporting the surface 8a of the block sealing member 8. The bars 42d are provided latticewise correspondingly to dicing lines 7b (see FIG. 5) and are each formed with a concave 42e as a relief of the blade 10.

In the frame member 42 shown in FIGS. 55 to 57, the tape substrate 41 is held under tension by means of fixing pins 42b provided at four corners of the frame member.

Next, a description will be given below about a semiconductor device manufacturing method according to a modification of the second embodiment.

In FIG. 58, the porous jig 36 and the support block 37 both referred to in the second embodiment are used in case of dicing a semiconductor wafer 44, not the assembled product 43.

The wafer dicing shown in FIG. 58 is carried out using a protective sheet 45 pre-affixed to a back surface 44a of the semiconductor wafer 44 instead of such a low-adhesion sheet 38 as shown in FIG. 42.

More specifically, the semiconductor wafer 44 is disposed on the porous jig 36 through the protective sheet 45 and is chucked from its back surface 44a side through the porous jig 36, then is half-cut with the blade 10.

In this case, the wafer dicing cost can be reduced because it is not necessary to use the low-adhesion sheet 38.

Thus, if there is used the support block with the porous jig 36 in the second embodiment incorporated therein, the dicing/decontaminating equipment in the second embodiment is employable not only in the dicing after block molding but also in the wafer dicing.

Although the present invention has been described above concretely by way of embodiments thereof, it goes without saying that the present invention is not limited to the above embodiments, but that various changes may be made within the scope not departing from the gist of the invention.

Although the semiconductor device referred to in the above first and second embodiments is BGA 9, there may be used any other semiconductor device such as, for example, LGA (Land Grid Array) or QFN (Quad Flat Non-leaded Package) insofar as a block sealing member 8 is formed on a wiring substrate and is subjected to dicing for assembly into individual products.

Further, as described in a modification of the second embodiment, the dicing/decontaminating equipment is employable also in wafer dicing.

The following is a brief description of effects obtained by typical modes of the present invention as disclosed herein.

By vacuum-chucking the surface of a block sealing member at the time of dividing a matrix substrate after block molding and carrying the dicing step in this state, the dicing can be effected without imposing any stress on an external terminal mounting surface of a wiring substrate and thus the external terminal mounting surface of the wiring substrate can be prevented from being flawed. Further, it is possible to enhance the dicing accuracy and reliability.

What is claimed is:

1. A method of manufacturing a semiconductor device, comprising the steps of:
 (a) providing a wiring substrate having a main surface, a plurality of device areas formed on the main surface, and a back surface opposed to the main surface;
 (b) mounting a plurality of semiconductor chips on the plurality of device areas, respectively;
 (c) forming a block sealing member over the main surface of the wiring substrate, the block sealing member covering the plurality of semiconductor chips;
 (d) after the step (c), dividing the block sealing member and the wiring substrate, and obtaining a plurality of individual semiconductor devices;

(e) after the step (d), arranging a number of first individual semiconductor devices of the plurality of individual semiconductor devices on a stage in a zig-zag manner;

(f) after the step (e), picking up the first individual semiconductor devices from the stage and and transferring them into a plurality of pockets of a tray.

2. A method of manufacturing a semiconductor device according to claim 1, wherein a plan shape of each of the plurality of individual semiconductor devices is quadranglar;

wherein a plan shape of each of the plurality of pockets is quadranglar; and wherein a guide is formed at each of four sides of each of the plurality of pockets.

3. A method of manufacturing a semiconductor device according to claim 2, wherein the wiring substrate has a dicing area arranged between adjacent device areas; and wherein in the step (d), the block sealing member and the wiring substrate are divided into the plurality of individual semiconductor devices by running a blade from the back surface of the wiring substrate and along the dicing area.

4. A method of manufacturing a semiconductor device according to claim 3, wherein a width of the blade is 0.2 mm.

5. A method of manufacturing a semiconductor device according to claim 1, wherein after the step (c) and before the step (d), a plurality of external terminals are attached on the back surface of the wiring substrate such that the plurality of external terminals are corresponding to the plurality of device areas, respectively.

6. A method of manufacturing a semiconductor device according to claim 1, wherein after the step (d) and before the step (e), the plurality of individual semiconductor devices are washed and dried.

7. A method of manufacturing a semiconductor device according to claim 1, wherein each of the plurality of individual semiconductor devices has a sealing member comprising a portion of the block sealing member; and wherein after the step (e) and before the step (f), a surface of the sealing member of each of the plurality of individual semiconductor devices is rubbed using a brush.

* * * * *